(12) United States Patent
Cutillas et al.

(10) Patent No.: US 8,553,737 B2
(45) Date of Patent: Oct. 8, 2013

(54) LASER EMITTER MODULES AND METHODS OF ASSEMBLY

(75) Inventors: Serge Cutillas, Tucson, AZ (US); Daming Liu, Tucson, AZ (US); Sang-Ki Park, Tucson, AZ (US); John Kelly Johnson, Tucson, AZ (US); Edmund Wolak, Tucson, AZ (US)

(73) Assignee: Oclaro Photonics, Inc., San Jose, CA (US)

( * ) Notice: Subject to any disclaimer, the term of this patent is extended or adjusted under 35 U.S.C. 154(b) by 390 days.

(21) Appl. No.: 12/337,275

(22) Filed: Dec. 17, 2008

(65) Prior Publication Data

US 2009/0251697 A1    Oct. 8, 2009

Related U.S. Application Data

(60) Provisional application No. 61/014,364, filed on Dec. 17, 2007.

(51) Int. Cl.
*H01S 3/04* (2006.01)
(52) U.S. Cl.
USPC .................................. 372/36; 372/34; 385/94
(58) Field of Classification Search
USPC ........................ 372/34–36; 385/94
See application file for complete search history.

(56) References Cited

U.S. PATENT DOCUMENTS

| 4,428,647 A | 1/1984 | Sprague |
| 4,763,975 A | 8/1988 | Seifres |
| 4,910,539 A | 3/1990 | Mathis et al. |
| 5,049,981 A | 9/1991 | Dahringer |
| 5,127,068 A | 6/1992 | Baer |
| 5,144,486 A | 9/1992 | Hart |
| 5,168,401 A | 12/1992 | Endriz |
| 5,230,969 A | 7/1993 | Savant et al. |
| 5,243,619 A | 9/1993 | Albers et al. |
| 5,365,366 A | 11/1994 | Kafka et al. |
| 5,367,529 A | 11/1994 | Holsinger et al. |
| 5,381,859 A | 1/1995 | Minakami et al. |
| 5,446,749 A | 8/1995 | Nighan et al. |
| 5,513,201 A | 4/1996 | Yamaguchi |
| 5,579,422 A | 11/1996 | Head et al. |
| 5,691,989 A | 11/1997 | Rakuljic et al. |
| 5,740,288 A | 4/1998 | Pan |

(Continued)

FOREIGN PATENT DOCUMENTS

| JP | 05-004112 | 1/1993 |
| JP | 09-159880 | 6/1997 |

(Continued)

OTHER PUBLICATIONS

International Search Report and Written Opinion mailed on Dec. 28, 2009 for International Application No. PCT/US2009/043182 filed on: May 7, 2009 and published as: WO/2009/137703 on: Nov. 12, 2009.

(Continued)

*Primary Examiner* — Kinam Park
(74) *Attorney, Agent, or Firm* — Grant Anderson LLP

(57) ABSTRACT

Embodiments are directed to laser emitter modules and methods and devices for making the modules. Some module embodiments are configured to provide hermetically sealed enclosures that are convenient and cost effective to assemble and provide for active alignment of optical elements of the module.

21 Claims, 9 Drawing Sheets

(56) References Cited

U.S. PATENT DOCUMENTS

| | | | |
|---|---|---|---|
| 5,740,292 A | 4/1998 | Strasser | |
| 5,787,107 A | 7/1998 | Leger | |
| 5,808,323 A | 9/1998 | Spaeth | |
| 5,825,551 A | 10/1998 | Clarkson | |
| 5,832,150 A | 11/1998 | Flint | |
| 5,848,083 A | 12/1998 | Haden et al. | |
| 5,986,794 A | 11/1999 | Krause | |
| 5,999,544 A | 12/1999 | Petersen | |
| 6,044,096 A | 3/2000 | Wolak et al. | |
| 6,064,515 A | 5/2000 | Yang | |
| 6,084,895 A | 7/2000 | Kouchi et al. | |
| 6,107,113 A | 8/2000 | Harmand et al. | |
| 6,160,664 A | 12/2000 | Du et al. | |
| 6,175,452 B1 | 1/2001 | Ullmann et al. | |
| 6,185,235 B1 | 2/2001 | Cheng et al. | |
| 6,215,598 B1 | 4/2001 | Hwu | |
| 6,314,116 B1 | 11/2001 | Wright et al. | |
| 6,331,692 B1 | 12/2001 | Krause et al. | |
| 6,335,822 B1 | 1/2002 | Toyohara | |
| 6,337,873 B1 | 1/2002 | Goering et al. | |
| 6,356,380 B1 | 3/2002 | Whitney | |
| 6,356,577 B1 | 3/2002 | Miller | |
| 6,389,198 B2 | 5/2002 | Kafka et al. | |
| 6,396,857 B1* | 5/2002 | Labranche et al. | 372/36 |
| 6,428,217 B1 | 8/2002 | Giltner | |
| 6,448,801 B2 | 9/2002 | Dischiano | |
| 6,493,148 B1 | 12/2002 | Anikitchev | |
| 6,504,858 B2 | 1/2003 | Cheng et al. | |
| 6,516,011 B1 | 2/2003 | Treusch | |
| 6,559,879 B1 | 5/2003 | Kobayashi et al. | |
| 6,594,092 B2 | 7/2003 | von Freyhold et al. | |
| 6,600,605 B1 | 7/2003 | Anikitchev | |
| 6,643,302 B1 | 11/2003 | Nishikawa et al. | |
| 6,736,554 B2 | 5/2004 | Kerboeuf et al. | |
| 6,768,593 B1 | 7/2004 | Jutamulia | |
| 6,771,686 B1 | 8/2004 | Ullman et al. | |
| 6,804,277 B2 | 10/2004 | Kimura et al. | |
| 6,822,978 B2 | 11/2004 | Kafka et al. | |
| 6,831,778 B2 | 12/2004 | Yang et al. | |
| 6,876,784 B2 | 4/2005 | Nikolov et al. | |
| 6,882,664 B2 | 4/2005 | Bolshtyansky et al. | |
| 6,888,679 B2 | 5/2005 | Brown | |
| 6,891,876 B2 | 5/2005 | Sutter et al. | |
| 6,897,486 B2 | 5/2005 | Loh | |
| 6,898,231 B2 | 5/2005 | Butterworth | |
| 6,919,990 B2 | 7/2005 | Anikitchev et al. | |
| 6,922,288 B2 | 7/2005 | Yamanaka et al. | |
| 6,922,419 B1 | 7/2005 | Nighan et al. | |
| 6,931,037 B2 | 8/2005 | Nighan et al. | |
| 6,969,206 B2 | 11/2005 | Iwanaga et al. | |
| 6,977,769 B2 | 12/2005 | Matsushita et al. | |
| 6,985,648 B2 | 1/2006 | Kish et al. | |
| 6,993,059 B2 | 1/2006 | Anikitchev et al. | |
| 7,006,194 B2 | 2/2006 | Sumiyoshi et al. | |
| 7,006,549 B2 | 2/2006 | Anikitchev et al. | |
| 7,010,194 B2 | 3/2006 | Anikitchev et al. | |
| 7,065,105 B2 | 6/2006 | Ehlers et al. | |
| 7,244,965 B2 | 7/2007 | Andrews et al. | |
| 7,259,907 B2 | 8/2007 | Langhans | |
| 7,322,754 B2 | 1/2008 | Wolf et al. | |
| 7,372,879 B2 | 5/2008 | Giaretta et al. | |
| 7,379,237 B1 | 5/2008 | Di Teodoro et al. | |
| 7,830,608 B2 | 11/2010 | Hu et al. | |
| 7,866,897 B2 | 1/2011 | Hu et al. | |
| 2002/0030200 A1* | 3/2002 | Yamaguchi et al. | 257/184 |
| 2002/0037142 A1* | 3/2002 | Rossi | 385/92 |
| 2002/0172475 A1 | 11/2002 | Miyazaki et al. | |
| 2003/0044132 A1 | 3/2003 | Nasu et al. | |
| 2003/0048987 A1 | 3/2003 | Saito et al. | |
| 2003/0161357 A1 | 8/2003 | Bolshtyansky et al. | |
| 2004/0095983 A1 | 5/2004 | Whitley | |
| 2004/0114860 A1 | 6/2004 | Dultz et al. | |
| 2004/0184753 A1* | 9/2004 | Teramura et al. | 385/128 |
| 2004/0213305 A1 | 10/2004 | Nakae et al. | |
| 2004/0252744 A1 | 12/2004 | Anikitchev et al. | |
| 2004/0258117 A1 | 12/2004 | Nebel et al. | |
| 2005/0018743 A1 | 1/2005 | Volodin et al. | |
| 2005/0069255 A1 | 3/2005 | Nishimura et al. | |
| 2005/0207454 A1 | 9/2005 | Starodoumov et al. | |
| 2005/0248819 A1 | 11/2005 | Hymel et al. | |
| 2005/0248820 A1 | 11/2005 | Moser et al. | |
| 2005/0257917 A1 | 11/2005 | East et al. | |
| 2006/0039418 A1 | 2/2006 | Anikitchev et al. | |
| 2006/0045143 A1 | 3/2006 | Anikitchev et al. | |
| 2006/0114955 A1 | 6/2006 | Steckman | |
| 2006/0126690 A1 | 6/2006 | Kido et al. | |
| 2006/0176912 A1 | 8/2006 | Anikitchev | |
| 2006/0263004 A1 | 11/2006 | Klimek et al. | |
| 2006/0274797 A1* | 12/2006 | Myers et al. | 372/35 |
| 2006/0280209 A1* | 12/2006 | Treusch et al. | 372/32 |
| 2007/0263684 A1 | 11/2007 | Nolan | |
| 2007/0268571 A1 | 11/2007 | Hu et al. | |
| 2007/0268572 A1 | 11/2007 | Hu et al. | |
| 2007/0291373 A1 | 12/2007 | Hu et al. | |
| 2007/0291813 A1 | 12/2007 | Hu et al. | |
| 2008/0008216 A1 | 1/2008 | Miller et al. | |
| 2008/0008217 A1 | 1/2008 | Miller et al. | |
| 2008/0101429 A1 | 5/2008 | Sipes et al. | |
| 2009/0104727 A1 | 4/2009 | Krejci et al. | |
| 2009/0115833 A1 | 5/2009 | Soulliaert et al. | |
| 2009/0251697 A1 | 10/2009 | Cutillas et al. | |
| 2009/0323175 A1 | 12/2009 | Mukai et al. | |
| 2010/0177796 A1 | 7/2010 | Miller | |
| 2011/0051758 A1 | 3/2011 | Krejci et al. | |
| 2012/0177074 A1 | 7/2012 | Liu et al. | |

FOREIGN PATENT DOCUMENTS

| | | |
|---|---|---|
| JP | 0411233857 A | 8/1999 |
| JP | 2001-82269 | 3/2001 |
| JP | 2001-343561 | 12/2001 |
| JP | 2002148491 A | 5/2002 |
| JP | 2003-131083 | 5/2003 |
| JP | 2003-198051 | 7/2003 |
| JP | 2004-022679 | 1/2004 |
| JP | 2004-096009 | 3/2004 |
| JP | 2005-167041 | 6/2005 |
| JP | 2007-149932 | 6/2007 |
| JP | 2007-300015 | 11/2007 |
| WO | WO 99/49343 | 3/1999 |
| WO | WO-02/077698 | 10/2002 |
| WO | WO 2007/137005 | 11/2007 |
| WO | WO 2009/037555 | 3/2009 |
| WO | WO 2009/079567 | 6/2009 |
| WO | WO 2009/137703 | 11/2009 |
| WO | WO 2010/081092 | 7/2010 |
| WO | WO 2010/118290 | 10/2010 |
| WO | WO 2011/091170 | 7/2011 |

OTHER PUBLICATIONS

U.S. Appl. No. 61/051,628, filed May 8, 2008, Wolak et al.

Andersen et al., "High Repetition Rate Tunable Femtosecond Pulses from Fiber Laser Pumped Parametric Amplifier," Advanced Solid-State Photonics, ME2, Abstract of Talk 4:30pm Jan. 30, 2006.

Becht, Vector phase conjuguation for beam combining in a pulsed Nd:YAG laser system, Proceedings of the SPIE—The International Society for Optical Engineering, 3263:11-19 (1998).

Brunner et al., "Powerful red-green-blue laser source pumped with a mode-locked thin disk laser," Optics Letters 29(16):1921-1923, Aug. 15, 2004.

Fuhr, Polarization power summing in laser diode communication systems, SPIE 740:70-76 (1987).

Ghislotti et al., Bidirectional Pumping of Er-Doped Fibers Using Detuned 980-nm Lasers, IEEE Photonics Technology Letters 14(5):780-782 2002.

Headley et al., Tapered Fiber bundles for combining laser pumps., Proceedings of the SPIE—The International Society for Optical Engineering, 5709(1):263-272 (200).

Knitsch et al., Diode Laser Modules of Highest Brilliance for Materials Processing, Proceedings of the SPIE, vol. 4651:256-263 (2002).

Kruglov et al., "Self-similar propagation of parabolic pulses in normal-dispersion fiber amplifiers," JOSA B, 19(3):461-469 2002.

Mecherle, Laser diode combining for free space optical communication, Proceedings of the SPIE—The International Society for Optical Engineering, 616:281-291 (1986).

Miyajima et al., Single Wavelength 5.6 Direct Diode Laser with a High-Efficiency Beam Combination, Jpn. J. Appl. Phys., 43(8):5269-5272 (2004).

Moser et al., "Volume Bragg Grating Devices," Friday Morning Optical Fiber Communications Conference, 2003, OFC 2003 pp. 644-645, vol. 2, Mar. 28, 2003.

Office Action mailed on Aug. 24, 2009 for U.S. Appl. No. 11/761,901, filed Jun. 12, 2007 published as: US 2007/0291813 A1 on Nov. 22, 2007.

Office Action mailed on Jan. 23, 2009 for U.S. Appl. No. 11/747,172, filed May 10, 2007 published as: US 2007/0268571 A1 on Nov. 22, 2007.

Office Action mailed on Feb. 25, 2009 for U.S. Appl. No. 11/759,885, filed Jun. 7, 2007 published as: US 2007/0291373 A1 on Dec. 20, 2007.

Office Action mailed on Jul. 19, 2007 for U.S. Appl. No. 11/352,500, filed Feb. 10, 2006 published as: US 2006/0280209 A1 on Dec. 14, 2006.

Office Action mailed on Jul. 29, 2008 for U.S. Appl. No. 11/747,172, filed May 10, 2007 published as: US 2007/0268571 A1 on Nov. 22, 2007.

Office Action mailed on Jul. 24, 2009 for U.S. Appl. No. 11/747,172, filed May 10, 2007 published as: US 2007/0268571 A1 on Nov. 22, 2007.

Ondax, Inc., "Volume Holographic Gratings (VHG)," 2005 pp. 1-7.

PCT International Search Report and Written Opinion for PCT/US2007/068717 Completed: Nov. 26, 2007.

Piper et al., 1.2 mJ, 37 ns single-moded pulses at 10kHz repetition rate from a Q-switched ytterbium fiber Laser, Abstract, In, Proceedings of CLEA/IQEC May 16-21, 2004: Conference on Lasers and Electro-Optics, Quantum Electronics and Laser Science. USA, Institute of Electrical and Electronics Engineers.

Rothenberg, Polarization beam smoothing for ineertial confinement fusion, J. Applied Physics, 87(8):3654-3662 (2000).

Sincerbox, Laser Beam Combining, IBM Technical Disclosure Bulletin, 12(10):1663-1664 (1970).

Steinmann et al., "Tunable fs Laser Pulses from OPA with MHz Repetition Rate," Advanced Solid-State Photonics, TuC6, Abstract of Talk, 12:30pm Jan. 31, 2006.

Thestrup et al, High brightness laser source based on polarization coupling of two diode lasers with asymmetric feedback, Applied Physics Letters, 82(5):680-682 (2003).

Treusch et al., High-Brightness Semiconductor Laser Sources for Materials Processing: Stacking, Beam Shaping, and Bars, IEEE Journal of Selected Topics in Quantum Electronics, 6(4):601-614 (2000).

Valdor Fiber Optics Catalog #910-00001, pp. 1-2 Impact Mount Singlemode Laser Pigtails.

Volodin et al., Wavelength Stabilization and spectrum narrowing of high-power multimode laser diodes and arrays by use of volume Bragg gratings. Optics Letters 29(16): Aug. 15, 2004.

Tra Fiberoptics, Inc. High-Powered SMA Connectors for Photonic Crystal Fiber. TraTech Fiberoptic, Inc. Brochure; 2004.

International Search Report and Written Opinion mailed on: Jul. 24, 2009 for International Application No. PCT/US2008/087198 filed on: Dec. 17, 2008 and published as: WO/2009/079567 on: Jun. 25, 2009.

International Search Report and Written Opinion mailed on Sep. 30, 2011 for International Application No. PCT/US2011/021931 filed on: Jan. 20, 2011 and published as: WO/2011/091170 on: Jul. 28, 2011.

International Search Report and Written Opinion mailed on Mar. 17, 2010 for International Application No. PCT/US2010/020647 filed on: Jan. 11, 2010 and published as: WO/2010/081092 on: Jul. 15, 2010.

International Search Report and Written Opinion mailed on Jun. 7, 2010 for International Application No. PCT/US2010/030486 filed on: Apr. 9, 2010 and published as: WO/2010/118290 on: Oct. 14, 2010.

Office Action mailed on Jul. 16, 2010 for U.S. Appl. No. 11/747,172, filed May 10, 2007 published as: US 2007/0268571 A1 on Nov. 22, 2007, issued as: 7,830,608 on Nov. 9, 2010.

Office Action mailed on Dec. 15, 2009 for U.S. Appl.No. 11/747,172, filed May 10, 2007 published as: US 2007/0268571 A1 on Nov. 22, 2007 issued as: 7,830,608 on Nov. 9, 2010.

Office Action mailed on Jul. 24, 2009 for U.S. Appl. No. 11/747,172, filed May 10, 2007 published as: US 2007/0268571 A1 on Nov. 22, 2007 issued as: 7,830,608 on Nov. 9, 2010..

Office Action mailed on Jan. 23, 2009 for U.S. Appl. No. 11/747,172, filed May 10, 2007 published as: US 2007/0268571 A1 on Nov. 22, 2007 issued as: 7,830,608 on Nov. 9, 2010.

Office Action mailed on Jul. 29, 2008 for U.S. Appl. No. 11/747,172, filed May 10, 2007 published as: US 2007/0268571 A1 on Nov. 22, 2007 issued as: 7,830,608 on Nov. 9, 2010.

Office Action mailed on Jul. 8, 2009 for U.S. Appl. No. 11/747,184, filed May 10, 2007 published as: US 2007/0268572 A1 on Nov. 22, 2007.

Office Action mailed on Dec. 10, 2008 for U.S. Appl. No. 11/747,184, filed May 10, 2007 published as: US 2007/0268572 A1 on Nov. 22, 2007.

Office Action mailed on Nov. 3, 2009 for U.S. Appl. No. 11/761,901, filed Jun. 12, 2007 published as: US 2007/0291813 A1 on Nov. 22, 2007 and Issued as: 7,680,170 on Mar. 16, 2010.

Office Action mailed on Sep. 23, 2010 for U.S. Appl. No. 11/973,207, filed Oct. 6, 2007 published as: US2008/0131060 A1 on Jun. 5, 2008 and Issued as: 7,866,897 on Jan. 11, 2011.

Office Action mailed on Feb. 18, 2010 for U.S. Appl. No. 11/973,207, filed Oct. 6, 2007 published as: US2008/0131060 A1 on Jun. 5, 2008 and Issued as: 7,866,897 on Jan. 11, 2011.

Office Action mailed on Sep. 2, 2009 for U.S. Appl. No. 11/973,207, filed Oct. 6, 2007 published as: US2008/0131060 A1 on Jun. 5, 2008 and Issued as: 7,866,897 on Jan. 11, 2011

Office Action mailed on Jan. 26, 2009 for U.S. Appl. No. 11/973,207, filed Oct. 6, 2007 published as: US2008/0131060 A1 on Jun. 5, 2008 and Issued as: 7,866,897 on Jan. 11, 2011.

Office Action mailed on May 17, 2013 for U.S. Appl. No. 13/004,679, filed Jan. 11, 2011 published as: US 2009/0251697 A1 on Oct. 8, 2009.

Office Action mailed on Jan. 14, 2013 for U.S. Appl. No. 13/004,679, filed Jan. 11, 2011 published as: US 2009/0251697 A1 on Oct. 8, 2009.

* cited by examiner

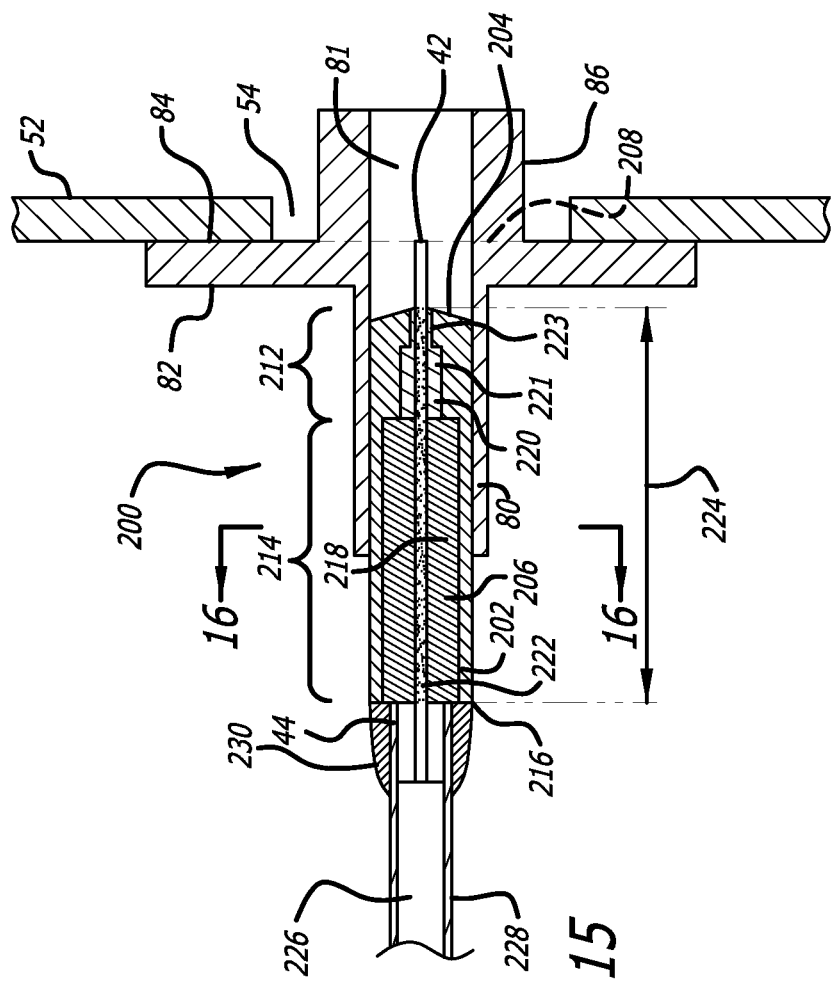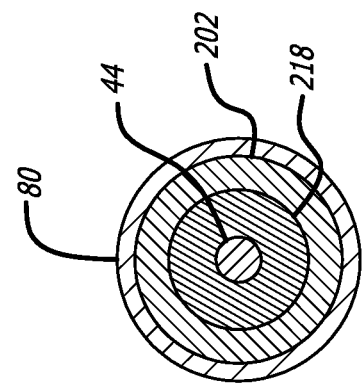

LASER EMITTER MODULES AND METHODS OF ASSEMBLY

RELATED APPLICATIONS

This application claims priority under 35 U.S.C. section 119(e) from U.S. Patent Application Ser. No. 61/014,364, filed Dec. 17, 2007, by S. Cutillas et al., titled "Laser Emitter Modules and Methods of Assembly" which is incorporated by reference herein in its entirety.

BACKGROUND

Applications requiring light energy and, in some embodiments, laser energy, may benefit from the use of solid state light sources such as laser diodes which are commonly available, reliable to operate and relatively cost effective as a laser energy source. Such devices may include a plurality of laser emitters in a single bar that emit laser light simultaneously in a common direction. In addition, multiple solid state or laser emitter bars may be disposed in a stacked configuration so as to generate even higher power levels. Typically the emitters of such solid state emitter bars generate significant amounts of heat during operation and are spaced from each other to allow sufficient cooling without the need for elaborate and expensive cooling systems.

Laser diode bars are often used for communication technology devices, medical applications and other applications such as military applications where it is desirable to couple the output of all the emitters of a single solid state emitter bar or multiple bars in a stacked configuration into a single optical fiber or other optical conduit. Some common optic mounting procedures are not suitable for hermetically sealed assemblies. For example, epoxy adhesive mounting of optical components in a hermetically sealed unit may not be suitable for some embodiments without organic getters because outgassing from the epoxy material may contaminate the system or optics within the system. As such, the heat dissipation and optical alignment requirements of such embodiments may make assembly and packaging of the diode bars difficult, particularly in systems where hermetic sealing of the assembly is required. As such, the heat dissipation and optical alignment requirements of such embodiments may make assembly and packaging of the diode bars difficult, particularly in systems where hermetic sealing of the assembly is required.

What has been needed are methods and devices for packaging one or more laser emitter bars that may be carried out in an efficient and cost effective manner that provides a reliable and robust configuration that efficiently dissipates heat generated by operation of the laser emitter bars. What has also been needed are such methods and devices which are suitable for providing such systems that are hermetically sealed.

SUMMARY

Some embodiments of an optical apparatus include a housing having a base, side walls and a lid. A heat sink spacer is secured to an inside surface of the base and a heatsink is secured to a top surface of the heat sink spacer. The optical apparatus includes a laser emitter bar which is secured to a top surface of the heat sink with an optical substrate secured to a top surface of the heat sink spacer. A fast axis collimator is mounted to the optical substrate adjacent an output surface of the laser emitter bar and is configured to substantially collimate the output of the laser emitter bar in a fast axis direction. A layer of thermally conductive and electrically insulative material is disposed between the laser emitter bar and the base of the housing so as to electrically isolate the laser emitter bar from the housing.

Some embodiments of an optical apparatus include a housing having a base, side walls and a lid with a heat sink spacer secured to an inside surface of the base. A heatsink having an upper layer of thermally conductive and electrically insulative material is secured to a top surface of the heat sink spacer. A laser emitter bar is secured to the thermally conductive and electrically insulative upper layer of the heat sink and an optical substrate is secured to a top surface of the heat sink spacer. A fast axis collimator is mounted to the optical substrate adjacent an output surface of the laser emitter bar and is configured to substantially collimate the output of the laser emitter bar in a fast axis direction.

Some embodiments of an optical apparatus include a housing having a base, side walls and a lid. A thermally conductive and electrically insulative heat sink spacer is secured to an inside surface of the base and a heatsink is secured to a top surface of the heat sink spacer. A laser emitter bar having a plurality of emitters is secured to a top surface of the heat sink. An optical substrate is secured to a top surface of the heat sink spacer. A fast axis collimator is mounted to the optical substrate adjacent an output surface of the laser emitter bar and is configured to substantially collimate the output of the laser emitter bar in a fast axis direction. For some embodiments, a beam conditioning optic may also be mounted on the optical substrate adjacent the fast axis collimator.

Some embodiments of an optical apparatus include a hermetically sealed enclosure having a base, a lid, side walls disposed between the base and the lid and an aperture disposed in a wall. A thermally conductive and electrically insulative heat sink spacer is secured to an inside surface of the base and a heatsink is secured to a top surface of the heat sink spacer. A laser emitter bar is secured to a top surface of the heat sink and an optical substrate secured to a top surface of the heat sink spacer. A fast axis collimator is mounted to the optical substrate adjacent an output surface of the laser emitter bar and is configured to substantially collimate the output of the laser emitter bar in a fast axis direction. A slow axis collimator is configured to collimate an output of the laser emitter bar in a slow axis direction of the output beam. An adjustable ferrule assembly having a flange is sealingly secured to a wall of the enclosure and an optical fiber is disposed within and secured to the adjustable ferrule assembly. A focusing optic is disposed in an optical train of the apparatus and is configured to focus an output of the laser emitter bar into an input surface of the optical fiber.

Some embodiments of a method of actively aligning a laser emitter module include providing a laser emitter module having a laser emitter bar and a housing. The housing includes a base and an aperture sized and positioned to accommodate an output beam of the laser emitter bar. The aperture is disposed in a wall of the housing which is in fixed relation to the base. The orientation and position of a selected surface of the housing is determined relative to an external reference member. The position and orientation of a facet of a laser emitter bar relative to the external reference member may then be used to align the laser emitter bar relative to the housing.

Some embodiments of a method of actively aligning a laser emitter module includes providing a laser emitter module having a housing. The housing includes a base, a laser emitter bar in fixed relation to the base and an aperture sized and positioned to accommodate an output beam of the laser emitter bar. The aperture is disposed in a wall of the housing which is in fixed relation to the base. At least one emitter of the laser emitter bar is activated and the characteristics of an output beam of the at least one activated emitter monitored by imaging of the output beam. Thereafter, a fast axis collimator is disposed in the output beam and aligned until the beam slope and edge sharpness achieve a desired quality. The fast axis collimator may then be secured in place relative to the housing. A slow axis collimator may then be disposed in the output beam and aligned until the beam slope and edge sharpness achieve a desired quality. The slow axis collimator may then be secured in place relative to the housing. A focusing optic may then be disposed in the output beam and aligned until the beam size and location achieve a desired quality. The focusing optic may then be secured in place relative to the housing.

Some embodiments of a method of actively aligning a laser emitter module include providing a laser emitter module having a laser emitter bar and a housing. The housing includes a base and an aperture sized and positioned to accommodate an output beam of the laser emitter bar. The aperture is disposed in a wall of the housing which is in fixed relation to the base. The orientation and position of a selected surface of the housing relative to an external reference member is determined. The position and orientation of a facet of a laser emitter bar relative to the external reference member is used to align the laser emitter bar relative to the housing. At least one emitter of the laser emitter bar may be activated and the characteristics of an output beam of the at least one activated emitter monitored by imaging the output beam. A fast axis collimator is disposed in the output beam and aligned until the beam slope and edge sharpness achieve a desired quality. The fast axis collimator may be secured in place relative to the housing. For some embodiments, a beam conditioning optic such as a reformatting element may be secured, either separately, or in combination as a sub-assembly with the fast axis collimator. Beam slope and edge sharpness, location of the spots in reference to a virtual reference set from a laser emitter bar facet, and total far field beam size may be factors considered in optimizing alignment. A slow axis collimator is disposed in the output beam and aligned until the beam slope and edge sharpness achieve a desired quality. The slow axis collimator may be secured in place relative to the housing. A focusing optic is disposed in the output beam and aligned until the beam size and location achieve a desired quality. The focusing optic may then be secured in place relative to the housing.

Some embodiments of a method of actively aligning elements of a laser emitter module include providing a laser emitter module that includes a housing. The housing may include a base, a laser emitter bar in fixed relation to the base and an aperture sized and positioned to accommodate an output beam of the laser emitter bar in a wall of the housing. The wall of the housing may be in fixed relation to the base. At least one emitter of the laser emitter bar is then activated. Characteristics of an output beam of the at least one activated emitter may then be monitored by imaging an output of the at least one emitter at a plane of the aperture and contemporaneously imaging the output of the at least one emitter in a far field beam during alignment of optical elements of the laser emitter module.

Some embodiments of a ferrule assembly for positioning an input surface of an optical fiber include an outer sleeve having a barrel portion with an inner bore and an input end. A flange member also extends radially from the barrel portion. A cylindrical fiber attachment sleeve having an input end is configured to slide axially within the inner bore of the outer sleeve and has an axial lumen disposed concentrically with an outer surface thereof. An optical fiber is secured within the axial lumen of the attachment sleeve. An input end of the optical fiber is disposed extending axially beyond the input end of the fiber attachment sleeve and within the inner bore of the outer sleeve.

Some embodiments of an optical apparatus include a housing having a base, a laser emitter bar secured in fixed relation to the base and a fast axis collimator configured to substantially collimate the output of the laser emitter bar in a fast axis direction. The apparatus also includes a ferrule assembly for positioning an input surface of an optical fiber having an outer sleeve with a barrel portion including an inner bore and an input end. A flange member extends radially from the barrel portion and is secured to the housing. A cylindrical fiber attachment sleeve is configured to slide axially within the inner bore of the outer sleeve and has an axial lumen which is concentrically disposed with respect to an outer surface thereof. The fiber attachment sleeve also includes an input end. An optical fiber is secured within the axial lumen with an input end of the optical fiber extending axially beyond the input end of the fiber attachment sleeve. The input end of the optical fiber is also disposed within the inner bore of the outer sleeve.

Some embodiments of an optical apparatus include a housing having a base, a laser emitter bar secured in fixed relation to the base having an output spectral band, and a fast axis collimator configured to substantially collimate the output of the laser emitter bar in a fast axis direction. A focusing element is configured to focus an output of the laser emitter bar and a reflective coating is disposed on an optical element of the apparatus. The reflective coating is configured to reflect a spectral band of light energy different from the spectral band of light energy emitted from the laser emitter bar.

Some embodiments of an optical apparatus include a laser emitter module including a housing having a base, a laser emitter bar secured in fixed relation to the base. The laser emitter bar has an output spectral band and a fast axis collimator configured to substantially collimate the output of the laser emitter bar in a fast axis direction. A focusing element is configured to focus an output of the laser emitter bar. An optical component coupled to the laser emitter module is configured to receive the output spectral band of the laser emitter bar. For some embodiments, such an optical component may communicate light energy having a spectral band different from the spectral band of the laser emitter bar back to the laser emitter module. A reflective coating is disposed on an optical element of the laser emitter module and is configured to reflect the spectral band communicated by the optical component coupled to the laser emitter module. The reflective coating is also configured to transmit the spectral band of the laser emitter bar.

Some embodiments of an optical apparatus include a housing having a base, a laser emitter bar secured in fixed relation to the base having an output spectral band and a fast axis collimator configured to substantially collimate the output of the laser emitter bar in a fast axis direction. A focusing element may be configured to focus an output of the laser emitter bar and an optical isolator may be disposed within or adjacent the housing and configured to prevent transmission of a spectral band of light energy different from the spectral band of the laser emitter bar back to the laser emitter bar.

Some embodiments of an optical apparatus include a laser emitter module having a housing with a base, a laser emitter bar secured in fixed relation to the base with an output spectral band and a fast axis collimator configured to substantially collimate the output of the laser emitter bar in a fast axis direction. A focusing element is disposed within housing and is configured to focus an output of the laser emitter bar. An optical component is coupled to the laser emitter module and is configured to receive the output spectral band of the laser emitter bar. Such an optical component may also communicate light energy having a spectral band different from the spectral band of the laser emitter bar back to the laser emitter module. An optical isolator may be disposed within or adjacent the housing and be configured to reflect the spectral band communicated by the optical component and transmit the spectral band of the laser emitter bar.

Some embodiments of a ferrule assembly for positioning an input surface of an optical fiber, include an outer sleeve having a barrel portion with an inner bore and an input end and a flange member extending radially from the barrel portion. A cylindrical fiber attachment sleeve is configured to slide axially within the inner bore of the outer sleeve and has a stepped axial lumen concentric with an outer surface. The stepped axial lumen includes a minor transverse dimension portion of the lumen extending proximally from an input end of the sleeve and a major transverse dimension portion of the lumen extending from the minor transverse dimension portion to a proximal end of the sleeve. An optical fiber is concentrically secured within the axial lumen with an input end of the optical fiber disposed distally beyond the input end of the fiber attachment sleeve and within the inner bore of the outer sleeve.

These features of embodiments will become more apparent from the following detailed description when taken in conjunction with the accompanying exemplary drawings.

BRIEF DESCRIPTION OF THE DRAWINGS

FIG. 15 is an elevation view in partial section of an embodiment of a ferrule assembly secured to a wall of a laser emitter module housing.

FIG. 16 is a transverse cross section of the ferrule assembly of FIG. 15 taken along lines 16-16 of FIG. 15.

DETAILED DESCRIPTION

Embodiments discussed herein are directed to methods and devices for packaging emitters such as laser emitter bars or chips having one or more emitters disposed therein. Embodiments discussed herein are also directed to methods and devices for coupling an output of laser emitter bars to an optical conduit, such as an optical fiber. Such bars or chips may be mounted to or otherwise incorporated into optical system embodiments by a variety of methods. For such optical packages, it is important that the output array of the chips be properly aligned, that such alignment may be carried out conveniently and accurately and that the final configuration dissipate the heat generated by the chip efficiently. For some embodiments, it may also be important that an enclosure of the optical components be hermetically sealed in order to provide reliability and consistency in the output of the assembly embodiments.

Figure 1:
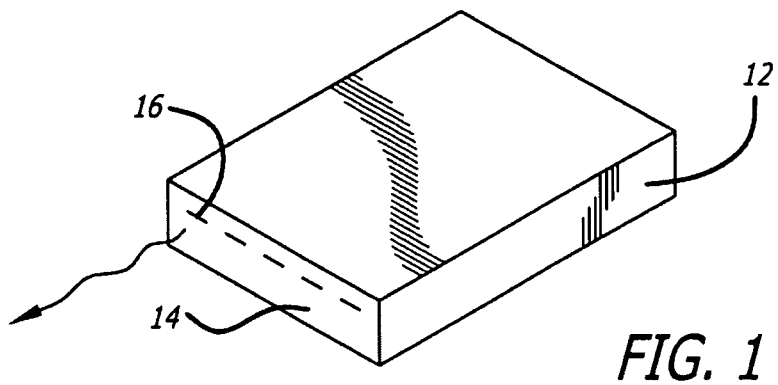
FIG. 1 is a perspective view of an embodiment laser emitter bar.
Figure 2:
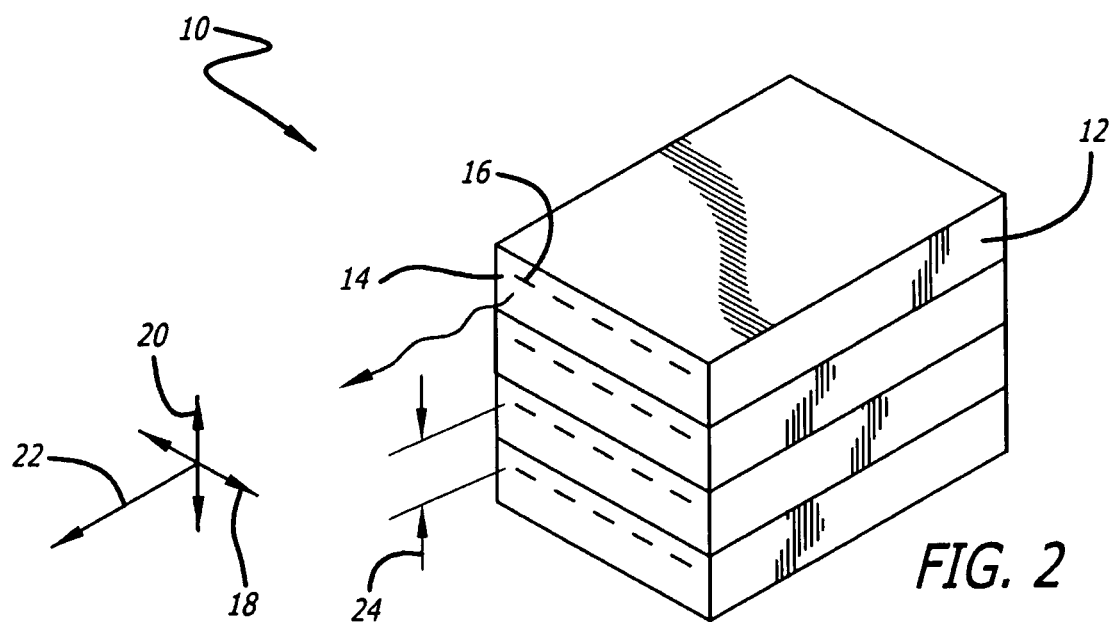
FIG. 2 is a perspective view of an embodiment of a stacked array of laser emitter bars.
Figure 3:
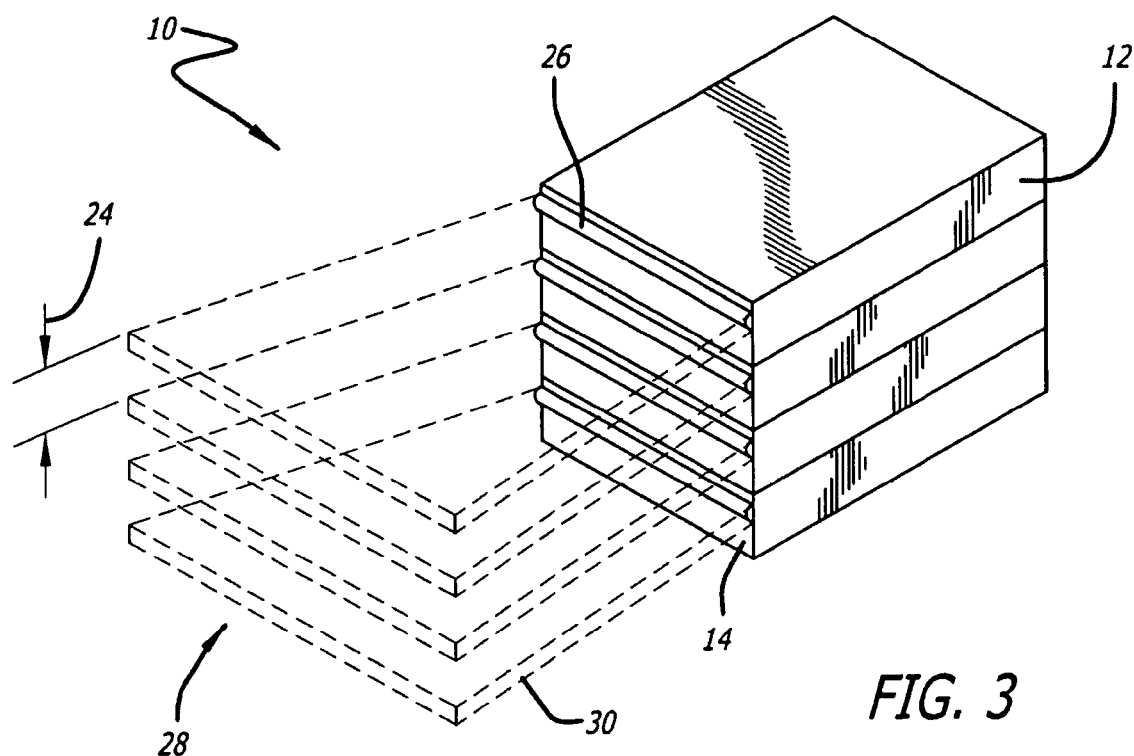
FIG. 3 shows an emission array of the laser emitter bars of the stacked array embodiment of FIG. 2.

FIG. 1 shows a laser emitter bar 12 having an output surface 14 that includes a total of 5 emitters 16 which have optical axes that are substantially parallel to each other. FIGS. 2 and 3 show a stacked array 10 of 4 laser emitter bars 12. Each laser emitter bar 12 has an output surface 14 that includes a total of 5 emitters 16 disposed adjacent each other. The emitters 16 of each bar 12 are disposed in a substantially linear row along a slow axis direction of the emitters 16, as indicated by arrow 18. A fast axis direction of the emitters 16 is perpendicular to the slow axis direction 18 and is indicated by arrow 20. The emitters 16 are positioned or otherwise configured so as to emit light energy in output beams that propagate along an emission axis 22 which may be perpendicular to both the slow axis direction 18 and fast axis direction 20. The emission axes 22 of the emitters 16 of the stacked array may be substantially parallel to each other.

The laser emitter bars 12 are stacked along a fast axis direction 20 of the emitters 16 and may be stacked in a periodic and regular distribution. In the embodiment of FIG. 2, the emitters of a bottom laser emitter bar 12 are vertically separated from the emitters of an adjacent laser emitter bar 12 by a distance indicated by arrow 24 which may be referred to as the pitch of the stacked array 10. For some stacked array embodiments 10, the pitch indicated by arrow 24 may be about 1 mm to about 3 mm, specifically, about 1.5 mm to about 2.0 mm. Such a stacked array 10 of laser emitter bars 12 and emitters 16 may allow a large amount of light energy or power to be produced in a compact device for some embodiments.

Laser emitter bar embodiments 12 may have any suitable number of emitters 16, such as about 1 emitter to about 100 emitters, more specifically, about 3 emitters to about 12 emitters. For some embodiments, each laser emitter bar 12 having about 5 emitters 16 may have an output power of about 5 W to about 50 W, more specifically, about 10 W to about 20 W. Emitters 16 may include laser diodes such as edge emitting laser diodes, vertical cavity surface emitting lasers (VCSELs) and the like. Materials for the emitters 16 of the laser emitter bar 12 may include semiconductor materials such as GaAs, InP or any other suitable laser gain medium.

Generally, the emitting aperture of a laser diode embodiment of an emitter 16 is rectangular in shape with the long dimension of the emitter 16 having a size of typically tens or hundreds of microns, while the short dimension is typically one to several microns in size. Radiation emerging from an emitter 16 diverges with the divergence angle being greater along the short emitter 16 direction. Divergence angles are lower in the direction of the long emitter 16 direction. Some embodiments of the emitters 16 may have a physical width of about 50 microns to about 300 microns, a height of about 1 micron to about 3 microns, and a cavity length of about 0.5 mm to about 5 mm. Such emitter 16 embodiments may have a divergence of light energy output of about 2 degrees to about 12 degrees in the slow axis direction 18 and a divergence of light energy output of about 30 degrees to about 75 degrees in the fast axis direction 20.

Some embodiments of the laser diode bars 12 may have emitters 16 that emit light energy having a wavelength of about 700 nm to about 1500 nm, more specifically, about 800 nm to about 1000 nm. Emitters 16 may emit light having a centroid or peak wavelength of about 300 nm to about 2000 nm, more specifically, of about 600 nm to about 1000 nm, including wavelengths across the near infrared spectrum. Some particular embodiments of useful emitters may emit light at a peak wavelength of about 350 nm to about 550 nm, 600 nm to about 1350 nm or about 1450 nm to about 2000 nm. Such laser diode bars may be operated in either a pulsed mode or continuous wave mode. Frequently, the output spectral band of individual emitters 16 which are not wavelength controlled (for example wavelength controlled by providing wavelength-dependent feedback from a volume index grating or the like) may be about 0.5 nm to about 2.0 nm or more. Due to the variation in peak emission wavelength in addition to the spectral band for each individual emitter, the overall bandwidth of the laser emitter bar 12 may be about 2 nm to about 5 nm, for some embodiments. Stacked array 10 includes 4 laser emitter bars 12, however, other embodiments of stacked arrays 10 may have any suitable number of laser emitter bars 12. Some stacked array embodiments 10 may have about 2 laser emitter bars 12 to about 30 laser emitter bars 12, more specifically, about 2 laser emitter bars 12 to about 10 laser emitter bars 12.

Referring to FIG. 3, stacked array 10 is shown with a fast axis collimator 26 in the form of a cylindrical lens array optionally disposed over the emitters 16 of the stacked array 10 and configured to substantially collimate an output beam of the emitters 16 of each laser emitter bar 12 in a fast axis direction 20. Although the embodiment shown in FIG. 3 illustrates the fast axis collimator secured directly to the bars 12, the same collimating effect may be achieved with the fast axis collimator 26 secured apart from and in fixed relation to the bar or bars 12 as will be discussed in more detail below. Fast axis collimator 26 may include one cylindrical lens for each laser emitter bar 12 or one or more monolithic lens arrays as well as any other suitable configuration. This fast axis collimation of the emitter output produces an output array 28 as shown wherein the light energy output 30 of each emitter 16 of each laser emitter bar 12 is substantially collimated along the fast axis 20 of the emitters 16 but continues to diverge along the slow axis 18 of the emitters 16. The light energy outputs 30 of each laser emitter bar 12 may have a substantially rectangular cross section transverse to the direction of propagation and are parallel to each other so as to produce the output array 28 as shown. Optionally, any variety of beam condition devices may be positioned on or in close proximity to the output surface 14. Exemplary beam conditioning devices include, without limitations, volume Bragg grating, gratings, beam combiners, polarizers, beam twisters, and the like.

FIGS. 4-7 illustrate an embodiment of an optical apparatus assembly 40 in the form of a laser emitter module for coupling the output of a laser emitter bar 12 into an input surface 42 of an optical fiber 44. The assembly 40 includes a hermetically sealed enclosure in the form of a housing 46 having a base 48, a lid 50, and side walls 52 which are disposed between the base 48 and the lid 50. An aperture 54 is disposed in a wall 52 opposite the laser emitter bar 12 and is configured to accept an adjustable ferrule assembly 56 having a radially extending flange 58 which may be sealingly secured to a wall of the enclosure 46. The aperture 54 may also be sized to as to allow an output 30 of the laser emitter bar 12 to pass through the aperture 54 in order to actively align the optical components of the apparatus 40 as will be discussed in more detail below. More specifically, the aperture 54 may be a relatively large aperture 54 disposed in a wall of the enclosure 46 which is substantially aligned with an output axis 60 of the laser emitter bar 12. A transverse dimension and position of the aperture 54 relative to the laser emitter bar 12 may be configured to allow substantially all of the emitted light output 30 of the laser emitter bar 12 from a fast axis collimator 62 or other collimating optic to pass through the aperture 54. For some embodiments, the aperture 54 may have a transverse dimension of about 3 mm to about 20 mm, more specifically, about 5 mm to about 10 mm. Although laser emitter bar 12 is shown with 5 emitters 16, the module 40 may include a laser emitter bar 12 having any suitable number of emitters 16 as discussed above.

The housing 46 also includes one or more apertures disposed on a wall opposite the aperture 54 that is configured to accommodate a plurality of high current electrical conductors. For the embodiment shown, a first electrical conductor 64 and second electrical conductor 66 are used to provide electrical power to the interior of the housing 46 for powering the laser emitter bar or bars 12 disposed within the housing 46. The conductors 64 and 66 may include solid conducting material or be configured as a multifilament braid or strand for flexibility. The conductors 64 and 66 may be made from materials having high degree of electrical conductivity such as copper, silver, gold or the like. Portions of the conductors 64 and 66 are secured in a fixed and sealed relation to a flange member 58 that may in turn be secured in a fixed and sealed relation to a wall 52 of the housing 46. The seal between the conductors 64 and 66 and the flange 58 and the flange 58 and the housing 46 may be a hermetic seal for some embodiments.

A thermally conductive and electrically insulative heat sink spacer 70 may be secured to an inside surface 72 of the base 48 with a bonding agent layer (not shown) disposed between the heat sink spacer 70 and base 48. The heat sink spacer embodiment 70 shown is substantially rectangular having an upper surface which is substantially parallel to a lower surface thereof. For some embodiments, the heat sink spacer 70 may be configured to provide a thermally conductive and electrically insulative platform upon which to mount a heatsink 74. The heatsink 74 may be used as a platform to mount the laser emitter bar 12 of the module 40. For some embodiments, the laser emitter bar 12 may be secured to the heatsink 74 with thermally conductive adhesive bonding, thermal compression bonding, soft solder, hard solder, including gold tin solder or the like.

The bonding agent layer between the heat sink spacer 70 and the base 48, which may be a thin substantially uniform layer covering the entire bottom surface of the heat sink spacer 70, may include hard solder, soft solder, thermally conductive adhesive such as silver epoxy or silver glass, welding, glass attaching or the like. Suitable solders for the bonding agent layer between the heat sink spacer 70 and the base 48 may include InSn, AgSn, AuGe and AuSn solders as well as others. For some hard solder embodiments such as AuSn, the Au concentration may be about 80 percent to about 86 percent relative to the Sn concentration. For some embodiments, however, the use of soft solder may serve to isolate the heatsink spacer 70 from thermal expansion and/or distortion of the base 48. For some embodiments, a hard solder may have a melting point of at least about 280 degrees Celsius and a soft solder may have a melting point below about 280 degrees Celsius. For some embodiments, the bonding agent layer between the heat sink spacer 70 and the base 48 may have a thickness of about 10 microns to about 150 microns.

The thermal conductivity of the heat sink spacer 70 may provide a conduit for the dissipation of thermal energy produced by the laser emitter bar 12 which passes through the heatsink 74. For some embodiments, the insulative electrical properties of the heat sink spacer 70 may be configured to electrically isolate the laser emitter bar 12 from the base 48 and enclosure 46 generally. For some embodiments, a thermally conductive and electrically insulative material of the heat sink spacer 70 may include a ceramic such as aluminum nitride as well as other suitable materials. For some embodiments, the heatsink spacer 70 may also include a material having a coefficient of thermal expansion that substantially matches the coefficient of thermal expansion of the base 48 of the enclosure 46. It may also be desirable, for some embodiments, for the heatsink spacer 70 to have a Young's modulus of about $1.5 \times 10^{11}$ Pa to about $4 \times 10^{11}$ Pa, more specifically, about $3 \times 10^{11}$ Pa to about $3.5 \times 10^{11}$ Pa. For some embodiments, the heatsink spacer 70 may have a thickness of about 0.5 mm to about 5 mm, more specifically, about 1 mm to about 3 mm The heatsink element 74 for dissipation of heat generated by the laser emitter bar 12 may be secured to a top surface of the heat sink spacer 70 by a bonding agent layer (not shown) disposed between a top surface of the heat sink spacer 70 and a bottom surface of the heat sink element 74. As discussed above, the laser emitter bar 12 may be secured to a top surface of the heat sink element 74 by a variety of suitable methods. For some embodiments, the heat sink element 74 may be rectangular in shape with an upper surface that is substantially parallel to a bottom surface thereof. The heat sink element 74 may be made from a thermally conductive material that may be electrically conductive for some embodiments and electrically insulative for other embodiments. For some embodiments, the heatsink element 74 may have a thickness of about 0.5 mm to about 5 mm, more specifically, about 1 mm to about 3 mm.

The bonding agent layer between the heat sink spacer 70 and the heat sink element 74, which may be a thin substantially uniform layer covering the entire bottom surface of the heatsink element 74 for some embodiments, may include hard solder, soft solder, thermally conductive adhesive such as silver epoxy or silver glass, welding, glass attaching or the like. Suitable solders for the bonding agent layer between the heat sink spacer 70 and the heat sink element 74 may include silver tin AgSn, indium silver InAg, gold germanium AuGe and gold tin AuSn solders. For some hard solder embodiments such as AuSn, the AuSn solder may have an Au concentration of about 80 percent to about 86 percent relative to the Sn concentration. In some cases, it may be desirable for the coefficient of thermal expansion of the heatsink element 74 to substantially match a coefficient of thermal expansion of the heat sink spacer 70. For example, in some embodiments, the heat sink spacer 70 may be made of aluminum nitride having a coefficient of thermal expansion of about 4.2 ppm per degree Celsius and the heatsink element 74 may be made from copper tungsten having a coefficient of thermal expansion of about 6.5 ppm per degree Celsius. As such, for embodiments wherein the difference between coefficients of thermal expansion of the heat sink spacer 70 and heatsink element 74 is less than about 3 ppm per degree Celsius, a soft solder such as AgSn or InAg may be desirable for the bonding agent layer. For some embodiments, the bonding agent layer between the heat sink spacer 70 and the heat sink element may have a thickness of about 10 microns to about 150 microns.

An optional optical substrate 76 may also secured to an upper surface of the heat sink spacer 70 with the fast axis collimator 62 secured to an upper surface of the optical substrate 76. For some embodiments, the optical substrate 76 may include a ceramic or glass having a low thermal conductivity and may have a coefficient of thermal expansion that is substantially the same as the coefficient of thermal expansion of the heat sink spacer 70. The optical substrate 76 may be secured to the heatsink spacer 70 by soldering, welding or glass attaching for some embodiments. For some embodiments, the optical substrate 76 may be secured to the heatsink spacer 70 by epoxy bonding. For some embodiments, the heat sink spacer 70 may serve to mechanically isolate the laser emitter bar 12, fast axis collimator 62 and optical substrate 76 from the housing 46.

Figure 4:
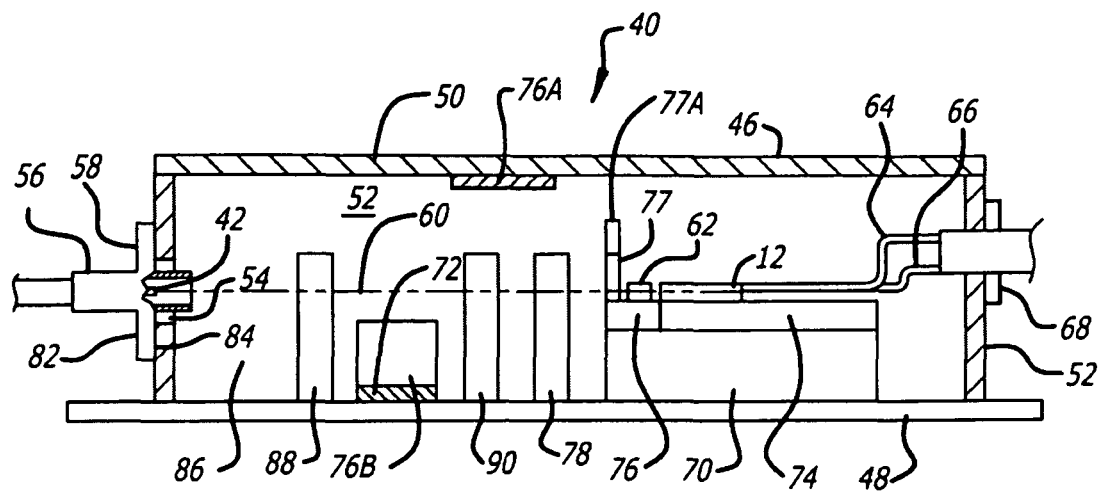
FIG. 4 is an elevation view in partial section of an embodiment of a laser emitter module.

For some embodiments of apparatus 40, such as hermetically sealed embodiments thereof, it may be desirable to include organic getters within the housing when bonding agents that may produce outgassing, such as epoxies, are used. FIG. 4 shows an organic getter assembly 76A secured to the inside surface of the cover 46 and an organic getter assembly 76B clipped to the base 48. Such getter assemblies 76A and 76B may be included in any of the module embodiments discussed herein. The organic getter assemblies 76A and 76B may be configured to absorb organic outgassing that occurs within the interior of the module 40. Such organic getter assemblies may be included within any of the module assembly embodiments discussed herein.

The fast axis collimator 62 is secured in a fixed position adjacent an output surface 14 of the laser emitter bar 12. The fast axis collimator 62, which may include an elongate cylindrical lens, may be configured to substantially collimate the output of the laser emitter bar 12 in a fast axis direction. For some embodiments, the fast axis collimator 62 may be secured to the optical substrate 76 by soldering, welding or glass attaching. For some embodiments, the fast axis collimator 62 may be secured to the optical substrate 76 by epoxy bonding. For some embodiments, a beam conditioning element may be secured to the top surface of the optical substrate 76 in addition to the fast axis collimator 62.

For some embodiments of module 40, one or more beam conditioning optics 77, that may include beam reformatting optics, may be disposed in the optical train of the module 40 between the fast axis collimator 62 and optional optical components 90, or any other suitable position. Such beam conditioning optics 77 may be secured separately from or in combination with the fast axis collimator 62 as a sub-assembly. For the embodiments shown in FIGS. 4 and 8, the beam conditioning optics 77 are secured in fixed relation to the base 48 of the housing 46 by securing the conditioning optics 77 to the optical substrate 76 which is, in turn, secured to the respective heat sink spacer. The beam conditioning optic 77 may be secured to the optical substrate 76, heat sink, heat sink spacer or directly to the base 48 by soldering, welding, glass bonding, adhesive bonding including epoxy bonding or the like. For some embodiments, the beam conditioning optic 77 may be actively positioned prior to being secured in fixed relation to the housing 46 by the methods of active alignment discussed herein. Beam slope and edge sharpness, location of the spots in reference to a virtual reference set from a facet of a corresponding laser emitter bar 12, and total far field beam size are factors that may be considered in optimizing the alignment. Some embodiments of the beam conditioning optic 77 may serve as a beam reformatting optic that serves to twist individual beamlets around an axis of propagation or re-format a horizontally adjacent segment to a vertical orientation.

The beam conditioning optic 77 may have an optional handle portion 77A secured to the optic 77 so as to facilitate handling of the optic 77 during assembly of the module 40. The handle portion 77A may include a block of rigid or semi-rigid material that is secured to the optic 77 by adhesive bonding, soldering or the like such that the handle portion 77A extends from an upper surface of the optic 77. This may allow the optic 77 to be grasped and positioned by tweezers or other handling equipment during assembly without making contact with the critical input and output surfaces of the optic 77. The handle portion 77A may also be secured to either side of the optic 77. The material of the handle portion may be a material similar to that of the optic 77 such as glass, quartz, silica or the like for some embodiments. Such handle portions 77A may also be secured to any of the other optical components discussed herein to facilitate assembly of the module embodiments.

Figure 4A:
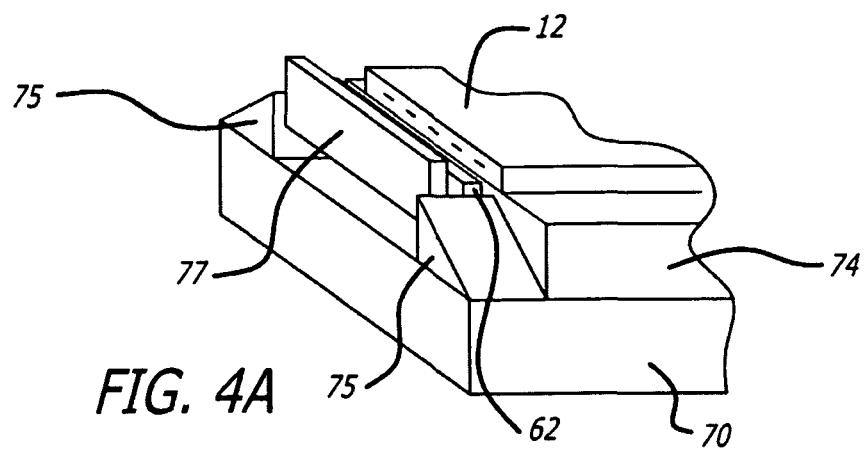
FIG. 4A is a perspective view of a portion of an embodiment of a laser emitter module partially cut away.

Referring to FIG. 4A, a portion of module 40 is shown that does not include optical substrate 76 and has the beam conditioning optic 77 secured to the heat sink spacer 70 by means of a pair of wedge shaped prism members 75. The prism members 75 have a bottom surface secured directly to the heat sink spacer 70 with adhesive bonding, soldering or the like. A side surface of each respective prism member 75 is secured to an opposing lateral side of the beam conditioning optic 77 by the same or similar method as used for the bond with the heat sink spacer 70. The beam conditioning optic 77 is positioned in front of and aligned with an output of the laser emitter bar 12. The material of the prism members 75 may be a material similar to that of the optic 77 such as glass, quartz, silica or the like for some embodiments. The fast axis collimator 62, for the embodiment shown in FIG. 4A, is secured directly to a rear surface of the beam conditioning optic 77. The side surfaces of the fast axis collimator 62 may also be secured to respective side surfaces of the prism members 75.

Figure 13:
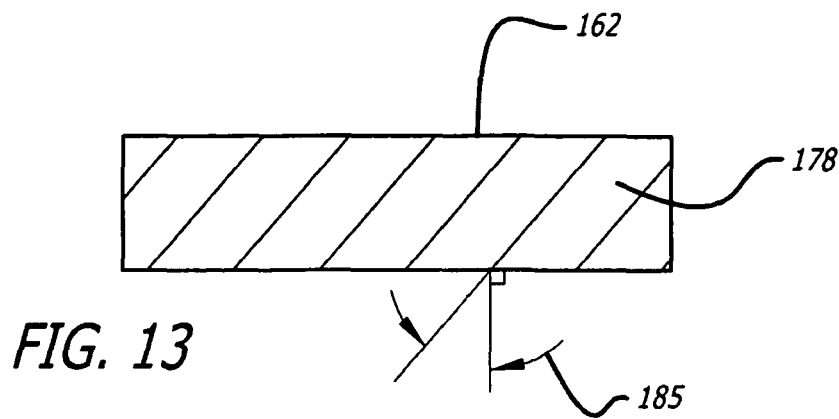
FIG. 13 is an elevation view of an embodiment of a beam conditioning optic.
Figure 14:
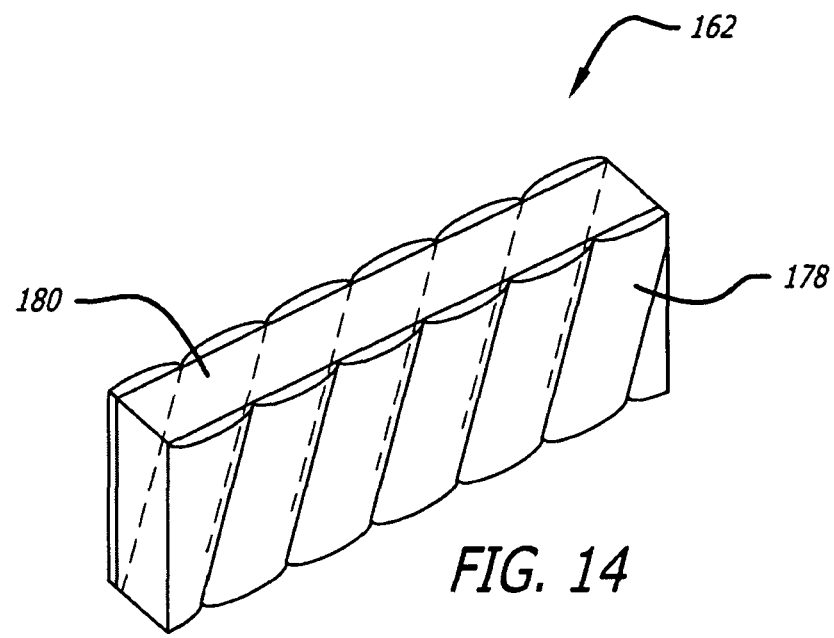
FIG. 14 is a perspective view of the beam conditioning optic of FIG. 13.

Embodiments of beam conditioning optics are described in U.S. patent application Ser. No. 11/747,184, titled "Multiple Emitter Coupling Devices and Methods with Beam Transform Systems", filed May 10, 2007, by Y. Hu et al., which is incorporated by reference herein in its entirety. In particular, U.S. patent application Ser. No. 11/747,184 discusses a variety of beam transform systems which may be used as a beam conditioning optic 77 for the laser emitter module embodiments discussed herein. One such beam conditioning or transform optic is shown in FIGS. 13 and 14 herein and discussed further below.

A slow axis collimator 78 configured to collimate an output of the laser emitter bar 12 in a slow axis direction 18 of the output beam may also be secured to the base 48 shown in FIG. 4. The slow axis collimator 78 may include a cylindrical lens or lens array configured to carry out collimation of the output of the laser emitter bar 12. The slow axis collimator 78 may be secured in fixed relation to the base by soldering, welding, glass bonding or the like as well as with the use of epoxy bonding for some embodiments. In addition, the slow axis collimator 78 may be actively positioned prior to being secured by any of the methods of active alignment discussed herein.

Figure 5:
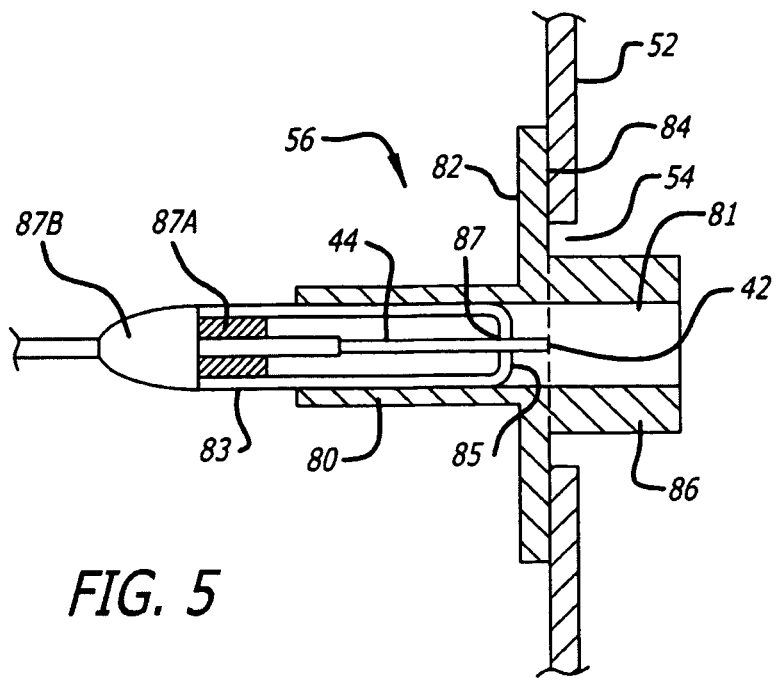
FIG. 5 is an elevation view in partial section of an embodiment of a ferrule assembly secured to a wall of a laser emitter module housing.
Figure 6:
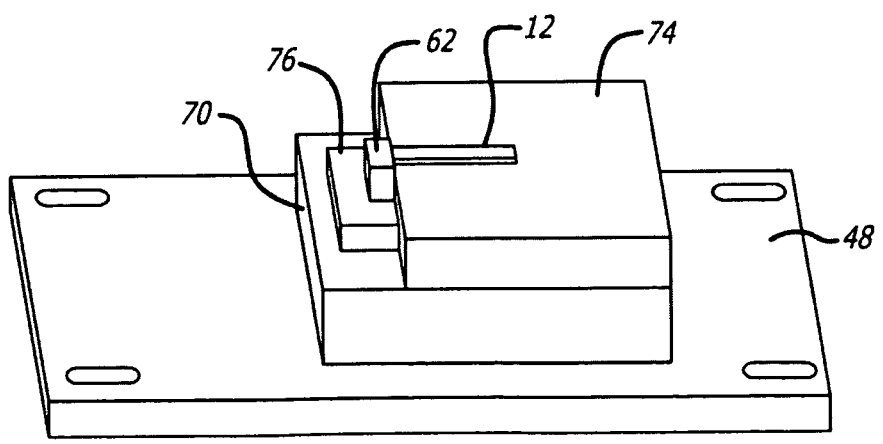
FIG. 6 is a perspective view of an embodiment of a mounting assembly for mounting a laser emitter bar and fast axis collimator to a base of a housing.
Figure 7:
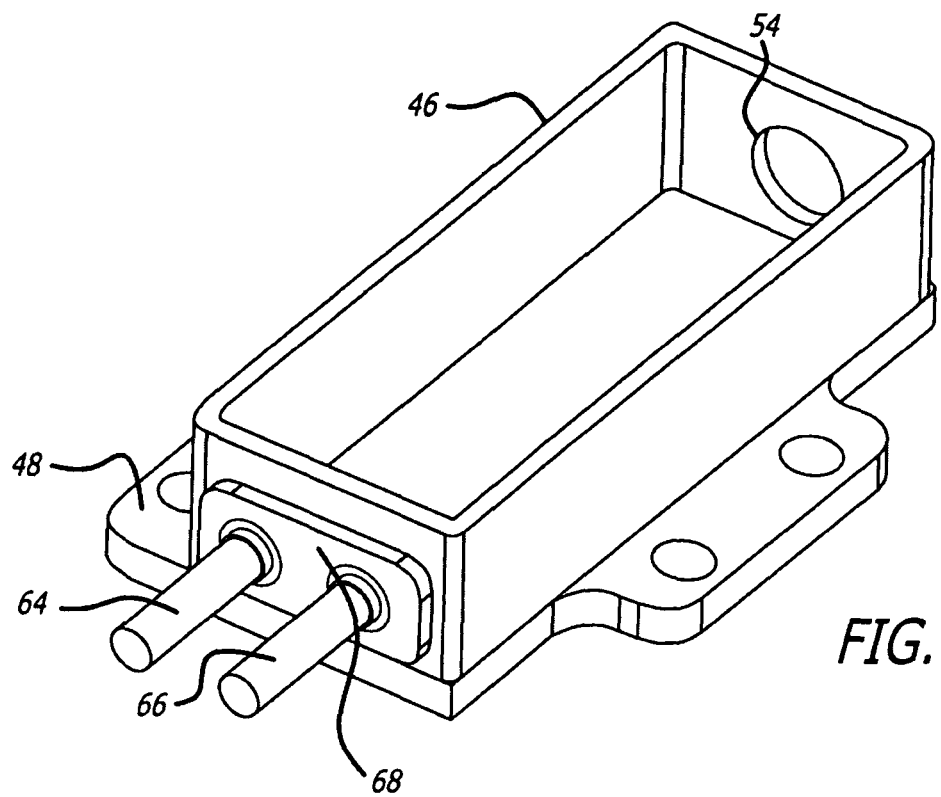
FIG. 7 is perspective view of an embodiment of a base and side wall portion of an enclosure of a laser emitter module having a large aperture in a wall thereof.

Referring to FIGS. 4 and 5, the optical fiber 44 is disposed within and secured to the adjustable ferrule assembly 56 that includes an outer sleeve having central tubular barrel 80 and a flange portion 82 that extends radially from the barrel 80. The barrel 80 includes a substantially concentric inner lumen 81 that extends from a first end of the barrel 80 to a second end of the barrel 80. The flange portion 82 may include a flat inner surface 84 configured to mate with an outer surface of the wall 52 of the enclosure adjacent the aperture 54. The flange portion 82 also has an outer transverse dimension greater than an outer transverse dimension of the aperture 54. The flange portion 82 may also include a shallow cylindrical boss portion 86 with a transverse dimension less than a transverse dimension of the aperture 54 such that the boss portion 86 may mechanically engage the aperture 54 and be moved transversely to allow for adjustment of a position of the optical fiber input surface 42 prior to securing the ferrule 56 in fixed relation to the enclosure 46.

A cylindrical fiber attachment sleeve 83 having an input end 85 is configured to slide axially within the inner bore 81 of the outer sleeve barrel 80 and has an axial fiber receiving lumen 87 disposed concentrically with an outer surface thereof. An outer surface of the optical fiber 44 may be secured within the axial lumen 87 of the attachment sleeve 83 by a variety of suitable methods including crimping, soldering, brazing, welding, adhesive bonding or the like. A jacketed portion of the optical fiber 44 disposed proximal of the input end 42 may be potted in an adhesive 87A as shown, or otherwise secured to an inside surface of the fiber attachment sleeve 83. A resilient strain relief element 87B having a tapered configuration may also be disposed over the optical fiber 44 proximal of and secured to the attachment sleeve 83 so as to prevent damage to the optical fiber 44 as a result of bending stress.

The input end 42 of the optical fiber is disposed axially beyond the input end 85 of the fiber attachment sleeve 83 and within the inner bore 81 of the outer sleeve 80. For some embodiments, it may be desirable for the input end 42 of the optical fiber 44 to be in the same plane as the flat surface 84 of the flange portion 82 as indicated by the dashed line in FIG. 5. This configuration allows the flange portion 82 to be seam welded or laser seam welded to the wall 52 of the housing 46 with a minimum of mechanical distortion of the position of the input end 42 of the fiber 44 relative to the housing as a result of the welding process. This configuration may also serve to protect the input end 42 of the optical fiber 44 from contamination during laser seam welding of the outer sleeve 80 to the wall 52 of the housing for embodiments utilizing a welding attachment method.

For some embodiment, the input end 42 of the fiber 44 may be recessed within the inner lumen 81 from a front end of the boss 86 by an axial distance of about 0.5 mm to about 2 mm. For some embodiments, the inner lumen 81 may have an inner transverse dimension or diameter of about 1 mm to about 3 mm. For some embodiments, the outer sleeve 80 may be made from materials such as Kovar®, stainless steel such as 304L stainless steel, nickel such as 201 nickel. For some embodiments, the outer sleeve 80 may include suitable materials for laser welding that does not produce micro-cracks during laser seam welding to keep the module hermetically sealed. For some embodiments, the fiber attachment sleeve 83, the outer sleeve 80 and the surface 84 may include a coating that is configured to protect raw metal from corrosion. For some embodiments, such a corrosion protection coating may include an electrolytic nickel plating or any other coating material suitable for laser welding that does not produce micro-cracks during laser seam welding to keep the module hermetically sealed. For some embodiments, the outer sleeve 80, fiber attachment sleeve 83 or both may be made from materials such as Arcap® or other materials suitable for soldering or epoxy attachment. For some embodiments, the input end 42 of the optical fiber 44 may extend from the input surface 85 of fiber attachment sleeve 83 a length of about 0.5 mm to about 1 mm.

For the embodiment shown, the flange portion 82 may be seam welded around its entire circumference to the wall 52 of the housing 46 to produce a hermetic seal between the outer sleeve 80 and the housing 46. The fiber attachment sleeve 83 may also be seam welded around an entire circumference of an outer surface thereof the a proximal portion of the outer sleeve 80 to produce a hermetic seal between the outer sleeve 80 and the fiber attachment sleeve 83. If the outer surface of the fiber 44 is soldered or otherwise hermetically sealed to the lumen 87 of the fiber attachment sleeve, a hermetic seal between an outer surface of the fiber 44 and the housing may be produced that produces a reliable seal and also allows for adjustment of radial and axial position of the input end 42 of the optical fiber 44 during assembly of the apparatus 40. In addition, the lid 50 of the enclosure 46 may also be secured to the housing 46 by a hermetic sealing technique such as soldering, laser seam welding or the like. As such, a hermetic seal may be created between an outer surface of the optical fiber 44 and an interior cavity of the enclosure 46 as a whole.

A focusing element 88 may be disposed in an optical train of the apparatus 40 extending from the emitters 16 of the laser emitter bar 12. The focusing element 88 may be configured to focus an output of the laser emitter bar 12 into an input surface 42 of the optical fiber 44. The focusing element 88 may include one or more cylindrical lenses configured to focus the output beam of the laser emitter bar 12 in both the fast axis 20 and slow axis 18 for some embodiments. The focusing element 88 may be secured in fixed relation to the base 48 of the enclosure 46 by a variety of suitable methods including soldering, welding including laser welding, glass attach and the like. Epoxy bonding may also be used to secure the focusing element 88 for some embodiments. For some embodiments, the focusing element 88 may be actively positioned prior to being secured by any of the methods of active alignment discussed herein.

Optical components 90 in addition to those discussed above may also be operatively disposed within an optical train of the apparatus may include lenses, filters, prisms, polarizers, waveplates, such as ¼ waveplates and ½ waveplates. Such components may be used to condition the output of the laser emitter bar 12 in order to further enhance the coupling of the output to the optical fiber. In addition to these optical components, optical component 90 may include a spectral band conditioning element, such as a Volume Bragg Grating (VBG), may be used to narrow or otherwise condition the output beam of the emitters 16.

For some embodiments, the optical fiber 44 of the apparatus 40 may be coupled to an optical component to provide the optical component with a light energy source. For some embodiments, the optical component may be a laser, including optical fiber lasers and the like, which is coupled to the apparatus 40 for purposes of providing pump energy or the like. In such configurations, it may be important to prevent light energy from the optical component to be reflected or otherwise transmitted back into a laser emitter bar 12 of the apparatus 40. Such reflected or leaked light energy entering the apparatus and particularly the laser emitter bar 12 may be damaging to the apparatus. This may be particularly true where the optical component is capable of producing high energy pulsed light that is transmitted back to the apparatus 40 through the fiber 44. As such, it may be desirable for some embodiments of the apparatus to have a configuration that prevents such reflected light energy from reaching the laser emitter bar 12. Often, optical components, such as lasers, coupled to the apparatus 40 may operate at a spectral band that is different from the output spectral band of the laser emitter bar 12 of the apparatus 40. In such cases, a reflective coating may be disposed on one or more of the optical elements within the apparatus 40 that reflects light energy at the spectral band of the optical component coupled to the apparatus 40 but transmits light energy of a spectral band of the laser emitter bar 12 of the apparatus. It may also be desirable to include an antireflective coating on one or more of the optical elements of the apparatus that is antireflective at the spectral band of the laser emitter bar 12.

For some embodiments, an optical component coupled to the laser emitter module 40 may be configured to receive the output spectral band of the laser emitter bar and communicate light energy having a spectral band different from the spectral band of the laser emitter bar 12 back to the laser emitter module. A reflective coating may be disposed on an optical element of the laser emitter module and configured to reflect the spectral band communicated by the optical component coupled to the laser emitter module and transmit the spectral band of the laser emitter bar 12. Optical elements of the apparatus 40 that may be suitable for the application of such reflective and antireflective coatings may include the fast axis collimator 62, the slow axis collimator 78, the focusing element 88 or other optical elements 90 that may include beam conditioning optics and the like. For some embodiments, beam conditioning optics may include a beam re-formatting element which may be configured to twist individual beamletts around an axis of propagation or re-format a horizontally adjacent segment to a vertical orientation. For some embodiments, the spectral band of the laser emitter bar 12 may have a centroid wavelength of about 750 nanometers to about 999 nanometers, more specifically, about 900 nanometers to about 995 nanometers. Some embodiments of the reflective coating may be configured to reflect a spectral band having a centroid wavelength of about 1000 nanometers to about 1095 nanometers. Such a configuration may be suitable for an apparatus 40 coupled to an optical component that operates at a spectral band having a centroid wavelength of about 1000 nanometers to about 1095 nanometers and a laser emitter bar 12 having a spectral band output with a centroid wavelength of about 900 nanometers to about 995 nanometers.

For some embodiments, the reflective coating may include silicon dioxide, alumina, titanium oxide, tantalum oxide, zirconium oxide and halfnia as well as other suitable materials. It should be noted that although the desired effect described above may be achieved with the use of appropriately chosen reflective and antireflective coatings, the same or similar effect may be achieved with one or more optical isolators (not shown) disposed within or adjacent the laser emitter module 40. For some embodiments, such an optical isolator may have a high level of transmission at emitter wavelengths of about 750 nanometers to about 999 nanometers, more specifically, about 900 nanometers to about 995 nanometers, when that radiation is directed towards an input end 42 of optical fiber 44. Some such isolator embodiments may also have low optical transmission or high reflectivity of light energy having a wavelength of about 1000 nanometers to about 1150 nanometers or more, more specifically, about 1040 nanometers to about 1095 nanometers, directed in a direction different from that of the output of the emitters, such as from the optical fiber 44 towards the emitters. Some embodiments of suitable optical isolators may include a first polarizing element that transmits light energy that has a polarization orientation substantially parallel to the polarization of laser emitter bar 12, a polarization rotating element and a second polarizing element that is oriented such that it is highly transmissive to light energy from the laser emitter bar 12 but substantially non-transmissive to light energy propagating in the opposite direction towards the laser emitter bar 12.

Figure 8:
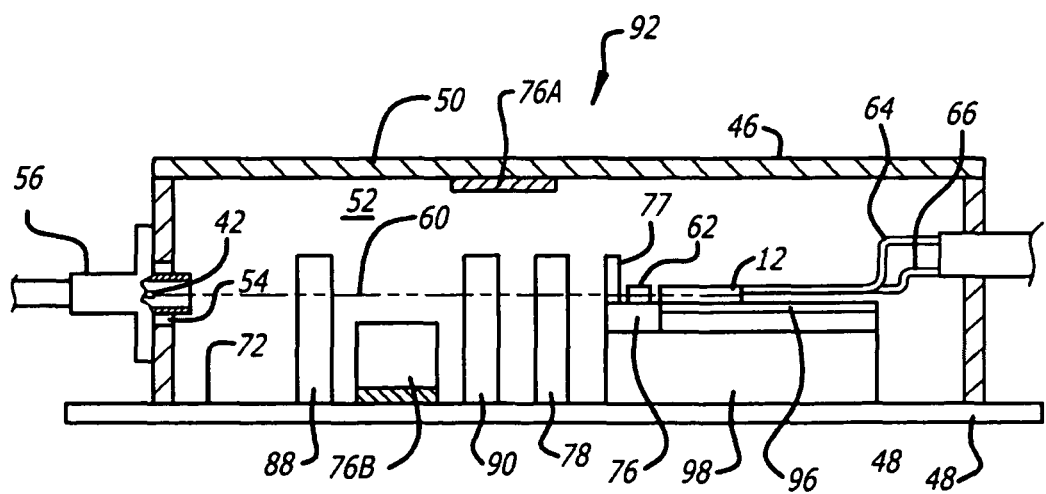
FIG. 8 is an elevation view in partial section of an embodiment of a laser emitter module.

FIG. 8 illustrates an embodiment of an optical apparatus assembly 92 for coupling the output of the laser emitter bar 12 with an input surface 42 of an optical fiber 44. The apparatus embodiment 92 of FIG. 8 may have some of the same or similar features, dimensions and materials as the features, dimensions and materials of the apparatus 40 discussed above with regard to FIGS. 4-7. However, for the embodiment 92 of FIG. 8, the heat sink element 94 may include an upper layer of thermally conductive and electrically insulative material 96 which may obviate the need for such properties in the heatsink spacer element 98 of the assembly 92. More specifically, the heat sink spacer element 98 may still require relatively high thermal conductivity but may be made of an electrically conductive material.

The apparatus 92 includes a housing 46 having a base 48, side walls 52 and a lid 50. A heat sink spacer embodiment 98 is secured to an inside surface of the base 48. Embodiments of the heatsink spacer 98 may include ceramic or metal. Metal materials may be acceptable for construction of some embodiments because of an electrically insulative layer which is on the upper surface of the heat sink 94 which is secured to a top surface of the heat sink spacer 98. The heatsink element 94 includes the upper layer of thermally conductive and electrically insulative material 96 which is disposed on the upper level of the heatsink 94 and forms the top surface of the heatsink 94. The thermally conductive and electrically insulative material 96 may include a ceramic material such as aluminum nitride and may serve to electrically isolate the laser emitter bar 12 from the base 48. For some embodiments, the heatsink element 94 may have a thickness of about 0.5 mm to about 5 mm, more specifically, about 1 mm to about 3 mm, and the upper layer of thermally conductive and electrically insulative material 96 may have a thickness of about 100 microns to about 500 microns, more specifically, about 300 microns to about 400 microns.

The laser emitter bar 12 may be secured to the thermally conductive and electrically insulative upper layer 96 of the heat sink 94 by suitable methods such as thermally conductive adhesive bonding, thermal compression bonding or the like. An optical substrate 76 is also secured to a top surface of the heat sink spacer 98 by any suitable method. A fast axis collimator 62 is secured to the optical substrate 76 adjacent an output surface 14 of the laser emitter bar 12 and is configured to substantially collimate the output of the laser emitter bar 12 in a fast axis direction 20. Optional beam conditioning optic 77 may be similarly mounted or secured between the fast axis collimator 62 and optic 90 as shown.

In order to achieve a desired or optimum level of operating efficiency, the laser emitter bar 12 and optical elements of the laser emitter modules 40 and 92 need to be properly aligned along an optical axis of the devices. One means for achieving a high level of such optical alignment is to use an active alignment technique whereby the optical elements of the module are aligned while the emitters 16 of the laser emitter bar 12 are emitting light energy through the optical element. For such methods, the output of the laser emitters 16 of the laser emitter bar 12 must be accessible to diagnostic equipment use to monitor beam quality emanating from the optical elements. The large aperture 54 allows such access, provided the output 30 of the laser emitter bar 12 is sufficiently aligned to as to pass substantially through the large aperture during operation. In order to align an output of the laser emitter bar 12 with the large aperture, an arrangement such as shown in FIGS. 9-11 may be used.

Figure 9:
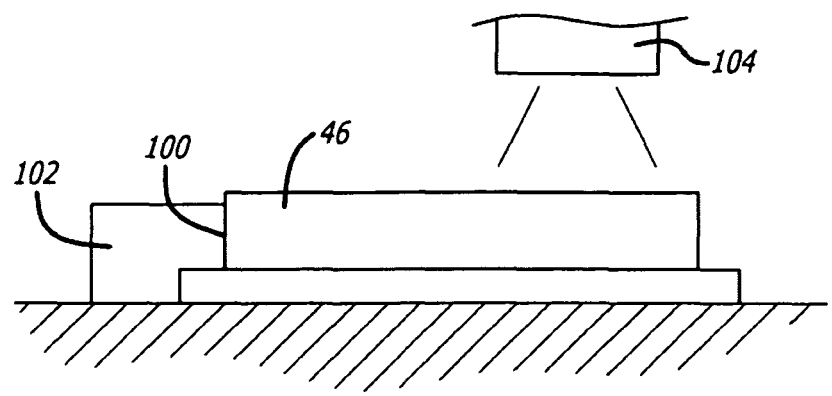
FIG. 9 is an elevation view of an embodiment of a housing of a laser emitter module having a front surface in contact with a datum block.
Figure 10:
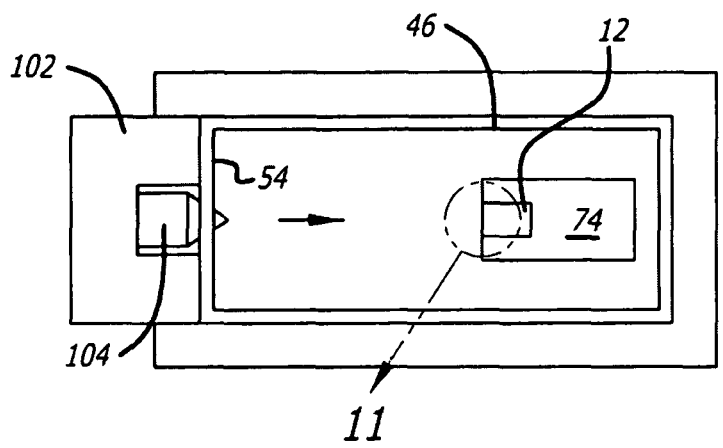
FIG. 10 is a top view of the laser emitter module of FIG. 9.
Figure 11:
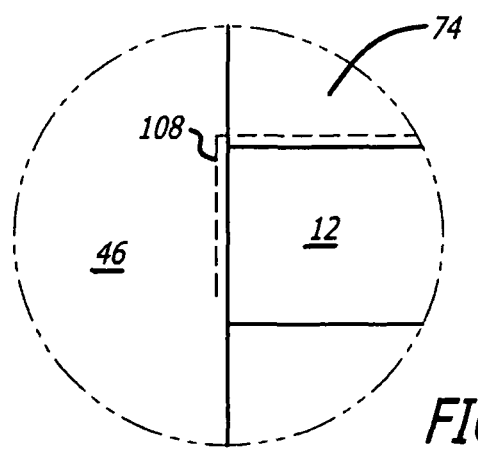
FIG. 11 is an enlarged view of a reticle aligned with a front and side surface of a laser emitter bar.

Referring to FIGS. 9-11, a method of aligning a laser emitter module include positioning a housing 46 of a laser emitter module 40 against a datum surface or point so as to determine the orientation and position of a selected surface, such as the front surface 100, of the housing relative to an external reference member. FIGS. 9 and 10 show the front surface 100 of the housing 46 of the laser emitter module 40 disposed firmly against a mating surface of a datum block 102 such that the position of the front surface 100 of the housing 46 is known relative to the datum block 102. As shown in FIG. 10, the position of the housing 46 relative to the datum block 102 is further restrained by the penetration of a tapered conical plug 104 into the aperture 54 of the housing 46. In this arrangement, the mating surface of the datum block 102 prevents front to back motion of the housing 46 and the tapered conical plug 104 prevents lateral or side to side motion as well as vertical motion of the housing 46 relative to the datum block 102. For some embodiments, the conical plug 104 may be biased by a resilient force such as a spring force in a forward direction such that the mating conical surface of the conical plug 104 engages the aperture 54 with a constant engaging force to help maintain the position of the housing 46 relative to the datum block 102.

An imaging device, such as a CCD camera 106, may be disposed in a position to image an interior portion of the housing 46 during the alignment procedure. The camera 106 is in fixed relation to the datum block 102 such that position relative to the datum block may also be used to determine position relative to the field of view of the camera 106. As shown in FIG. 11, the field of view of the camera 106 includes a reticle 108 having two lines perpendicular to each other that indicate the proper position of the forward facet of the laser emitter bar 12 in order to achieve proper alignment of the optical axis of the laser emitter bar output with the aperture 54 of the housing. As such, the position and orientation of a facet of a laser emitter bar 12 relative to the external reference member 102 may then be used to align the laser emitter bar 12 relative to the housing 46 such that a majority of an output from the laser emitter bar 12 will pass through the aperture by aligning the front facet and side surface of the laser emitter bar 12 with the corresponding lines of the reticle 108. Fine adjustment of the position of the laser emitter bar may be carried out with robotic tools that may include pneumatic tweezers and the like that may be precisely positioned with respect to the housing. Once the laser emitter bar 12 has been properly aligned with the reticle 108, the laser emitter bar 12 may be secured into fixed relation with the housing by soldering, thermally conductive adhesive bonding, thermal compression bonding or the like.

Figure 12:
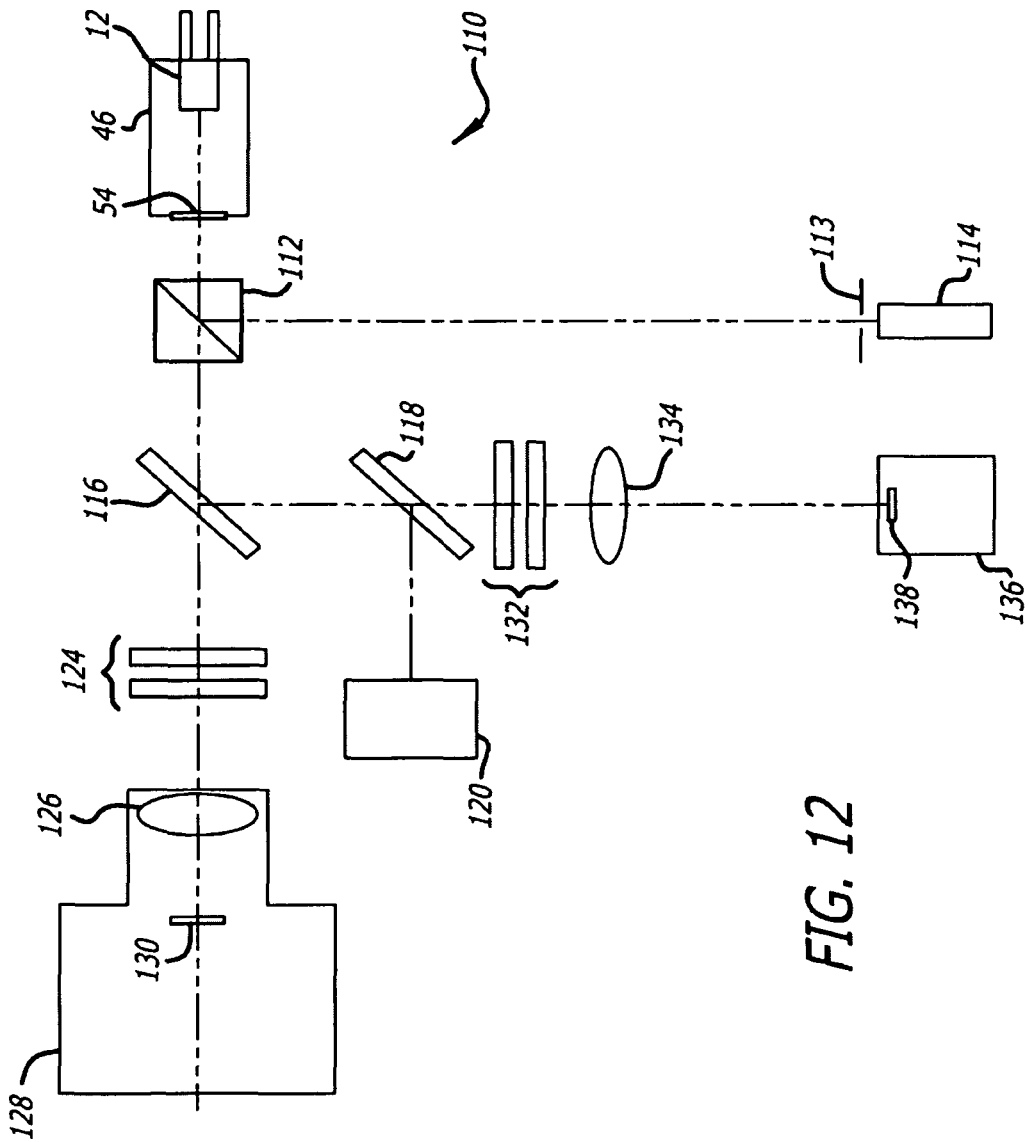
FIG. 12 is a schematic view of an embodiment of a housing for mounting of a laser emitter bar with an open top portion and an embodiment of a beam profile device aligned with an output beam of the laser emitter bar.

Once the laser emitter bar 12 has been properly positioned and secured within the housing 46, the optical elements of the module 46 may be actively aligned with the optical axis of the laser emitter bar 12 and secured in fixed position relative to the housing 46 as well. FIG. 12 illustrates the housing 46 and laser emitter bar 12 assembly disposed in functional relation with a beam profiling assembly 110. The housing 46 is positioned such that the output axis of the laser emitter bar 12 is oriented towards an input of the beam profiling assembly 110. The aperture 54 in the front of the housing 46 is open so as to allow the output of the laser emitter bar 12 to pass through the aperture 54 and be monitored and characterized by the beam profiling device 110 during embodiments of the active alignment process. The housing 46 may be secured in fixed relation to a datum block (not shown) which may be similar to the datum block 102 discussed above.

The housing 46 and datum block may in turn be secured to the assembly 110 that is configured to move in up to six degrees of freedom with respect to the optical element 62, 78, 88 or 90 in order to make the appropriate angular adjustments during the active alignment process of optical elements. For some embodiments, the roll, pitch and yaw of the laser emitter bar 12 may be adjusted relative to the optical elements to be positioned as well as X axis, Y axis and Z axis translation of the laser emitter bar 12 relative to the optical axis of the optical element being positioned. The optical elements to be positioned within the housing 46 include the fast axis collimator 62, the slow axis collimator 78, the focusing element 88 as well as any other beam conditioning optics 90. Although some embodiments of alignment methods are directed to mounting various optical elements in a specific order, for other embodiments, the optical elements may be mounted in any desired order.

The beam profiling assembly embodiment includes a beam splitter 112, a pinhole element 113 disposed in front of a reference laser 114, a first beam attenuator 116, a second beam attenuator 118, a beam stop 120, a first set of neutral density filters 124, a first lens 126, a first CCD camera 128 having a first CCD plane 130. The assembly also includes a second set of neutral density filters 132, a second lens 134 and a second CCD camera 136 having a second image plane 138.

For some embodiments of an active alignment procedure, the housing 46 with the laser emitter bar 12 secured thereto is positioned in front of the beam profiling device 110 prior to the addition of any other optical elements such as the fast axis collimator 62, slow axis collimator 78, focusing element 88 or other beam conditioning components 90. Once the housing 46 is positioned, the reference laser 114 may be activated. The reference laser 114 may be a helium neon laser, a low power red semiconductor laser or the like with a collimated output beam. The reference beam from the reference laser 114 travels through the pinhole 113, is reflected from the beam splitter 112 through the aperture 54 and onto the front facet surface of the laser emitter bar 12 or reference reflector which may be located at a front facet location. The reference beam is then reflected from a front facet of the laser emitter bar 12 or reference reflector which is located at a front facet location of the laser emitter bar 12. The reference laser 114 may be adjusted in order for the reflected beam from the front facet to be aligned with the pinhole 113. Thereafter, the reference laser beam may define the optical axis of the laser emitter bar as it will be perpendicular to the front facet or output surface 14 of the laser emitter bar 12. For some embodiments, a portion of a facet on a front surface of the laser emitter bar 12 may have a metal portion to increase the reflectivity of the surface. For some embodiments, metals such as gold may be used to increase the reflectivity of the laser emitter bar 12 facet. The reference beam reflected from the front facet of the laser emitter bar 12 may then be imaged by the first CCD camera 128. The point of impingement of the reference beam measured by the first CCD camera 128 may be used to determine the optical axis of the laser emitter bar 12. If the optical axis of the laser emitter bar 12 is not aligned, the position of the housing 46 may be adjusted until the optical axis of the emitter bar 12 is properly aligned.

Once the optical axis of the laser emitter bar 12 is properly established, the optical elements may be individually added, actively aligned and then secured in fixed relation to the housing 46. For some embodiments, 2 or more optical elements, such as optical elements 62, 78, 88 and 90, may be pre-attached in a sub-assembly and then the sub-assembly actively aligned and secured to housing 46. For some embodiments, the fast axis collimator 62 may be gripped by tweezers such as pneumatic tweezers, and positioned in front of the output surface 14 of the laser emitter bar 12. The emitters 16 of the laser emitter bar 12 may then be activated and the output beam of the laser emitter bar 12 monitored to determine the quality of alignment of the fast axis collimator 62 with respect to the optical axis of the laser emitter bar 12. The first beam attenuator 116 and the second beam attenuator 118 are used to attenuate the power of the beam by reflecting the wavelength of light energy being emitted from the laser emitter bar 12. The first set of neutral filters 124 and second set of neutral density filters 132 are used to reduce the intensity of the output of the laser emitter bar 12 in order to produce a beam intensity that is suitable for imaging by the first and second CCD cameras 128 and 136.

The quality of alignment of the fast axis collimator 62 is evaluated by measuring the angular distribution of the output beam which has been converted from spatial distribution of the output beam by the first lens 126. The angular distribution is measured with the first CCD camera 128. The beam location at the aperture 54 is also monitored by imaging the output beam at the aperture 54 of the housing with the second CCD camera 136 which may be used to measure the alignment of the optical axis of the output from the fast axis collimator 62. The alignment of the fast axis collimator 62 is adjusted until the beam position on the first and second CCD cameras, beam divergence and edge sharpness in a fast axis direction achieve a desired level or is otherwise optimized. Once the desired alignment of the fast axis collimator 62 is achieved, the fast axis collimator may be secured in fixed relation to the housing 46 and laser emitter bar 12. The fast axis collimator 62 may be secured with a mount portion of the fast axis collimator 62 contacting a mount portion of the optical substrate 76 by soldering, welding including laser welding, brazing, adhesive bonding or any other suitable method. The output signal of the first and second CCD cameras 128 and 136 or other imaging device may be monitored visually on the video display or may be monitored by other suitable display devices and methods. The fast axis collimator may be pre-assembled with the beam conditioning optic 77. The beam conditioning optic 77 may also be separately aligned and attached to the optical substrate 76, or a second optical substrate (not shown) either on the heat sink spacer 70 or package base 48.

Once the fast axis collimator 62 has been secured, and, optionally, the beam conditioning optic 77, the slow axis collimator 78 may then be gripped by tweezers such as pneumatic tweezers, and positioned in front of an output surface of the fast axis collimator 62 or any other suitable position in the optical train of the module 40. The emitters 16 of the laser emitter bar 12 may then be activated and the output beam of the laser emitter bar 12 monitored by the assembly 110 to determine the quality of alignment of the slow axis collimator 78 with respect to the optical axis of the laser emitter bar 12. The quality of alignment of the slow axis collimator 78 is evaluated by measuring the angular distribution of the output beam which has been converted from spatial distribution of the output beam by the first lens 126. The angular distribution is measured with the first CCD camera 128. The quality of alignment of the fast axis collimator 62 is also evaluated by imaging the output beam at the aperture 54 of the housing with the second CCD camera 136 which may be used to measure the alignment of the optical axis of the output from the slow axis collimator 78. The alignment of the slow axis collimator 78 is adjusted until the beam position on the first and second CCD cameras, beam divergence and edge sharpness in a slow axis direction achieve a desired level or is otherwise optimized. Once the desired alignment of the slow axis collimator 78 is achieved, the slow axis collimator 78 may be secured in fixed relation to the housing 46 and laser emitter bar 12. The slow axis collimator 78 may be secured with a mount portion of the slow axis collimator 78 contacting the housing or spacer disposed between the slow axis collimator 78 and housing by soldering, welding and laser welding, brazing, adhesive bonding or any other suitable method.

The focusing element 88 may then be gripped by tweezers such as pneumatic tweezers, and positioned in front of an output surface of the slow axis collimator 78 or any other suitable position in the optical train of the module 40. The emitters 16 of the laser emitter bar 12 may then be activated and the output beam of the laser emitter bar 12 monitored by the assembly 110 to determine the quality of alignment of the focusing element 88 with respect to the optical axis of the laser emitter bar 12.

The quality of alignment of the focusing element 88 is evaluated by measuring the spot size and position of the output beam at the plane of the aperture 54 of the housing 46. The spot size and position are monitored by second CCD camera 136 and the position of the focusing element 88 adjusted until the focal point is centered in the aperture 54. Once the desired alignment of the focusing element 88 is achieved, the focusing element 88 may be secured in fixed relation to the housing 46 and laser emitter bar 12. The focusing element 88 may be secured with a mount portion of the focusing element 88 contacting the housing by soldering, welding including laser welding, brazing, adhesive bonding or any other suitable method. Any or all of the optical elements 62, 78, 88 or 90 may be secured in fixed relation to the housing 46 by hard attaching each optical component that has been actively aligned. For some embodiments, each optical component that has been actively aligned may be hard attached to a respective mount site by laser welding or soldering.

Once the internal optical components of the assembly 40 have been actively aligned and secured in fixed relation to the housing 46, the optical fiber 44 and ferrule assembly 56 may be aligned and secured in fixed relation to the housing 46. For some embodiments, the input end 42 of the optical fiber 44 is aligned in relation to the focused output beam of the laser emitter bar 12 such that the optical coupling between the laser emitter bar 12 and the optical fiber 44 is maximized. Once the input end 42 of the optical fiber 44, barrel 80 and fiber attachment sleeve 83 of the ferrule assembly 56 have been properly positioned, the flange portion 82 of the ferrule assembly 56 may be secured in fixed relation to the housing 46 by soldering, welding including laser welding or other suitable methods in a configuration such as the configuration discussed above. In addition, the fiber attachment sleeve 83 may also then be secured to the outer sleeve 80 by soldering, welding including laser welding or other suitable methods in a configuration such as the configuration discussed above. Once the ferrule 56 has been secured, and, for some embodiments, hermetically sealed, the lid 50 of the housing 46 may be secured to the upper edge of the walls 52 of the housing 46 by soldering, welding including laser welding or other suitable methods. For embodiments, adhesive bonding, such as epoxy bonding may be used to secure the ferrule and lid.

FIGS. 13 and 14 illustrate an embodiment of a beam conditioning or transform optic 77 as discussed above and further discussed in incorporated U.S. patent application Ser. No. 11/747,184. The beam conditioning optic includes a refractive offset cylindrical lens array 162 for 90 degree beam rotation of each output from each emitter element 16 of an emitter bar 12. Some embodiments of such a refractive offset cylindrical lens array may include diagonally oriented cylindrical lens elements 178 that are symmetrically disposed on opposing parallel surfaces of a transmissive block or substrate 180 that may be made of a refractive solid such as glass or silica. The transmissive block 180 may be sized such that any opposing symmetrical pair of cylindrical lens elements 178 focus at the same point or line within the body of the transmissive block 180. Such a configuration will rotate an incident output beam by approximately 90 degrees, such that the fast axis and slow axis of the output beam are reversed. The rotation of individual output beams 16 may be useful to symmetrize the beam product and beam profile between the fast axis and slow axis and facilitates subsequent focusing or concentration of the output beams while maintaining brightness. The slant or angular orientation of the cylindrical lens elements 178 of the beam transform system 162 may be set to an angle of about 40 degrees to about 50 degrees, as indicated by arrows 185 in FIG. 13. Embodiments of refractive offset cylindrical lens arrays 162 for 90 degree beam rotation may include products such as produced by LIMO GmbH, Bookenburgeweg 4-8, Dortmund, Germany.

An embodiment of an adjustable ferrule assembly 200 that may be used with the module embodiments discussed herein is shown in FIGS. 15 and 16. Optical fiber 44 is disposed within and secured directly or indirectly to components of the adjustable ferrule assembly 200 which may have some features and materials which are the same as or similar to the ferrule assembly 56 shown in FIG. 5. The ferrule assembly 200 includes an outer sleeve having central tubular barrel 80 and a flange portion 82 that extends radially from the barrel 80. The barrel 80 includes a substantially concentric inner lumen 81 that extends from a first end of the barrel 80 to a second end of the barrel 80. The flange portion 82 may include a flat inner or front surface 84 configured to mate with an outer surface of the wall 52 of the enclosure adjacent the aperture 54 of the housing 46. The flange portion 82 also has an outer transverse dimension greater than an outer transverse dimension of the aperture 54. The flange portion 82 may also include a shallow cylindrical boss portion 86 with a transverse dimension less than a transverse dimension of the aperture 54 such that the boss portion 86 may mechanically engage the aperture 54 and be moved transversely to allow for adjustment of a position of the optical fiber input surface 42 prior to securing the ferrule assembly 200 in fixed relation to the enclosure 46. A cylindrical fiber attachment sleeve 202 having an input end 204 is configured to slide axially within the inner bore 81 of the outer sleeve barrel 80 with a close fit that is configured to maintain concentricity between the inner bore 81 and sleeve 202 but allow relative axial movement. The attachment sleeve 202 has a stepped axial fiber receiving lumen 206 disposed concentrically within an outer surface of the sleeve and extending the length thereof. An outer surface of the optical fiber 44 may be secured within the axial lumen 206 of the attachment sleeve 202 by a variety of suitable methods including crimping, soldering, brazing, welding, adhesive bonding or the like.

The input end 42 of the optical fiber 44 may be disposed axially beyond the input end 204 of the fiber attachment sleeve 202 and within the inner bore 81 of the outer sleeve 80, as shown, for some embodiments. For some embodiments, it may be desirable for the input end 42 of the optical fiber 44 to be substantially coextensive with or in the same plane as the flat front surface 84 of the flange portion 82 as indicated by the dashed line 208 in FIG. 15. This configuration allows the flange portion 82 to be seam welded or laser seam welded to the wall 52 of the housing 46 with a minimum of mechanical distortion of the position of the input end 42 of the fiber 44 relative to the housing as a result of the welding process. This configuration may also serve to protect the input end 42 of the optical fiber 44 from contamination during laser seam welding of the outer sleeve 80 to the wall 52 of the housing for embodiments utilizing a welding attachment method.

Some of the difficulties associated with coupling high energy laser light into an optical fiber input include losses from the optical fiber that result in heat generation and the dissipation of such heat, excess laser energy impinging on a portion of the ferrule assembly surrounding a fiber input and generating contaminants, position stability and maintaining a good seal between the optical fiber and the surrounding ferrule assembly 200 and module housing 46. The ferrule assembly embodiment 200 shown is configured to provide for and address at least some of these issues. More specifically, the stepped axial lumen 206 of the fiber attachment sleeve 202 extends a length thereof and is concentric with an outer surface of the sleeve 202. The stepped axial lumen 206 includes a minor transverse dimension portion 212 of the lumen extending proximally from an input end of the sleeve. The axial lumen also includes a major transverse dimension portion 214 of the lumen 206 extending from the minor transverse dimension portion 212 to a proximal end 216 of the sleeve 202. Different bonding materials, such as solders, may be disposed within the space between an outer surface of the optical fiber 44 and an inner surface of the respective portions of the axial lumen 206 so as to maximize the performance benefits of the different bonding materials. The stepped configuration of the axial lumen 206 may also make the connection between the fiber 44 and the ferrule assembly 200 more robust and facilitate assembly and manufacturing of the assembly.

For example, for some embodiments, the optical fiber 44 may secured to the fiber attachment sleeve 202 by a soft solder 218 which substantially fills the major transverse dimension portion 214 of the axial lumen 206 of the sleeve and a hard solder 220 which substantially fills a minor transverse dimension portion 212 of the axial lumen of the sleeve. The hard solder 220, for example gold tin solder AuSn, at the front end of the fiber attachment sleeve 202 may provide attachment having high strength, high thermal conductivity and high reflectivity. Such a configuration serves to hold the optical fiber 44 securely in place, dissipates heat well and tends to reflect surplus laser light energy that is imposed on the ferrule assembly 200, and particularly, a front surface 204 of the fiber attachment sleeve 202, that is not coupled into the optical fiber 44. One potential drawback to the use of such a hard solder 220 may be the expense of such a material. Such a hard solder attachment between an outer surface of the optical fiber 44 and an inner surface of the fiber attachment sleeve 202 may also generate unwanted mechanical stresses if extended over the entire axial length of the fiber attachment sleeve 202. As such, a less expensive soft solder 218, such as indium silver solder InAg may be disposed within the major transverse dimension portion 214 of the axial lumen 206 in order to backfill the lumen 206 after the application of the hard solder in the minor transverse dimension portion 212. This configuration may provide good mechanical stability and heat dissipation at a lower cost. The difference in melting point between the hard solder embodiments and soft solder embodiments also facilitates this backfill process. The hard solder 220 at the front end of the sleeve 202 may be applied first and the soft solder 218 having a lower melting point applied thereafter. The lower melting point of the soft solder 218 applied to the proximal portion of the sleeve 202 may also be helpful to prevent melting or other heat related damage to the polymer components of the fiber adjacent thereto and discussed below. For some embodiments, the boundary between the hard solder 220 and soft solder 218 may include a disc or barrier of material (not shown) that allows for thermal conductivity between the hard solder 220 and soft solder 218, but prevents mixing between the two solders.

For the embodiment shown in FIGS. 15 and 16, the minor transverse dimension portion 212 of the axial lumen 206 includes a step down in inner transverse dimension from the major transverse dimension portion and a second step down in inner transverse dimension within the minor transverse dimension portion. Such a configuration produces a first or proximal minor transverse dimension portion 221 and a second or distal minor transverse dimension portion 223 of the axial lumen 206 within the minor transverse dimension portion 212. This arrangement of multiple steps within the axial lumen 206 may be useful for lowering the cost of the attachment sleeve 202 as machining small diameter holes over extended lengths may be expensive for some manufacturing techniques. In particular, it may be difficult in some circumstances or expensive to produce a small diameter bore sized such as the second or distal minor transverse dimension of the axial lumen 206 over a length greater than about 5 times the inner transverse dimension of that bore. For some embodiments, the minor transverse dimension portion 212 may have an inner transverse dimension or diameter of about 125 microns to about 700 microns, generally for some embodiments. For some attachment sleeve embodiments 202, the second or distal minor transverse dimension of the minor transverse dimension portion 212 may have an inner transverse dimension of about 200 microns to about 400 microns, more specifically, about 250 microns to about 350 microns. For some embodiments, the first or proximal minor transverse dimension of the minor transverse dimension portion 212 may be about 500 microns to about 700 microns, more specifically, about 550 microns to about 650 microns, for some embodiments. The major transverse dimension portion 214 of the axial lumen 206 of the sleeve may have a substantially constant diameter over an axial length thereof and have an inner transverse dimension of about 500 microns to about 1500 microns, more specifically about 1150 microns to about 1250 microns, for some embodiments. The length of the minor transverse dimension portion 212 may be about 1 mm to about 2 mm, more specifically, about 1.4 mm to about 1.6 mm, for some embodiments. Although the fiber attachment sleeve embodiment 202 is shown having three different inner transverse dimension portions, other embodiments may include any suitable number of different transverse dimension portions including two, four, five or more.

For some embodiments, the fiber attachment sleeve 202 may have an axial length of about 5 mm to about 15 mm and an outer transverse dimension or diameter of about 1 mm to about 5 mm, more specifically, about 2 mm to about 3 mm. For some embodiments, it may be desirable for the fiber attachment sleeve 202 to have a wall thickness that is large enough to provide stable mechanical support to the optical fiber 44 disposed therein, as well as thin enough to allow sufficient heat transfer for soldering as well as other suitable processes during manufacturing or assembly. As such, for some embodiments, the wall thickness of the fiber attachment sleeve 202 between an outer surface thereof and the axial lumen 206 may be about 0.2 mm to about 1 mm, more specifically, about 0.3 mm to about 0.5 mm. The material of the fiber attachment sleeve 202 may also include a variety of coatings. For some embodiments, the fiber attachment sleeve may have an overall metallic coating of nickel or other suitable material having a thickness of about 2 microns to about 8 microns. A second coating of gold or other suitable material may be disposed only within the axial lumen 206 having a thickness of about 0.1 microns to about 2 microns. Such coatings may be useful for improving adhesion of bonding materials such as solders, adhesives and the like for some embodiments.

Another feature that may be useful in dissipating heat and maintaining a good hermetic seal between the optical fiber 44 and the ferrule assembly 200 includes the use of a metallic layer 222 disposed over an axial portion of the optical fiber 44 within the fiber attachment sleeve 202, as indicated by arrow 224 in FIG. 15. Such a layer 222 on an outer surface of the optical fiber 44, which may be deposited by any suitable method such as vapor deposition, sputtering, plating or the like, may be disposed over that portion of the optical fiber 44 that is secured to the fiber attachment sleeve 202. It may also be desirable to leave portions of the exposed optical fiber 44 uncoated by such a metallic layer. For some embodiments, the outer surface of the optical fiber 44 includes no metallic layer on a portion of the optical fiber portion that extends distally from the fiber attachment sleeve 202 or hard solder 220 disposed therein near the input end 42 of the optical fiber 44 where high energy laser light would otherwise come into direct contact with the metallic coating 222. For some embodiments, the metallic coating 222 may include a thin gold coating on an outer surface of the optical fiber 44 having a thickness of about 0.1 microns to about 2 microns. The metallic coating 222 may also include one or more intermediate or barrier layer coatings of materials including gold, nickel, titanium, chromium as well as any other suitable materials. For some embodiments, these coatings may be compatible with soldering or other bonding processes that reach temperatures of up to about 320 degrees Celsius. For some embodiments, it may also be useful to include such a metallic coating (not shown) on the input surface 204 of the fiber attachment sleeve 202 so as to maximize reflection of surplus laser energy incident on the surface 204.

At the proximal end 216 of the fiber attachment sleeve 202, the optical fiber 44 is coated by a polymer buffer 226, such as an acrylate buffer, which seals and protects an outer surface of the optical fiber 44 proximal of the ferrule assembly 200. For some embodiments, the acrylate buffer 226 may be a uniform coating over the optical fiber 44 and have a wall thickness of about 50 microns to about 100 microns. For some embodiments, the optical fiber 44 may also be coated with a layer of silicone material (not shown) having a numerical aperture lower than the glass or other material of the optical fiber and disposed between the optical fiber and the acrylate buffer 226. The acrylate buffer 226 may in turn be covered by a high strength polymer coating 228, including thermoplastic polyester elastomers such a Hytrel® manufactured by Dupont Corporation, coating that provides additional strength and protection to the optical fiber 44 proximal of the ferrule assembly 200 and facilitates attachment and strain relief between the optical fiber 44 and the ferrule assembly 200. Another benefit of using a soft solder 218 in the proximal portion or major transverse dimension portion 214 of the fiber attachment sleeve 202 is that the low melt temperature of about 125 degrees Celsius to about 175 degrees Celsius for some embodiments, allows the soldering process to take place during assembly of the ferrule assembly 200 without melting or otherwise compromising the polymer buffer 226 and coating 228 of the optical fiber 44 proximal of the fiber attachment sleeve 202. For some embodiments, the polymer coating 228 may have a wall thickness of about 0.2 mm to about 0.4 mm and have a shore hardness of about A65 to about A90. A tapered cylindrical strain relief 230 may be disposed over the polymer coating 228 adjacent the fiber attachment sleeve 202 and also secured to the proximal end 216 of the fiber attachment sleeve 202 so as to provide a smooth transition between the rigid fiber attachment sleeve 202 and the relatively flexible polymer coating 228 and buffer 226 proximal thereto. Such a smooth transition in flexibility may be useful to prevent breakage of the optical fiber 44 at stress points that may otherwise result from a sudden transition in mechanical support for the optical fiber 44. The strain relief 230 may be made of any suitable material, such as flexible polymer including a silicone, such as a room temperature vulcanization (RTV) silicone or the like.

For some embodiments, the input end 42 of the fiber 44 may be recessed within the inner lumen 81 from a front end of the boss 86 by an axial distance of about 0.5 mm to about 2 mm. For some embodiments, the inner lumen 81 of the outer sleeve may have an inner transverse dimension or diameter of about 1 mm to about 3 mm. For some embodiments, the outer sleeve 80, fiber attachment sleeve 202, or both, may be made from materials such as Kovar®, stainless steel such as 304L stainless steel, nickel such as 201 nickel and the like. For some embodiments, the outer sleeve 80 may include suitable materials for laser welding that does not produce micro-cracks during laser seam welding to keep the module hermetically sealed. For some embodiments, the fiber attachment sleeve 202, the outer sleeve 80 and the front surface 84 of the outer sleeve may include a coating that is configured to protect raw metal from corrosion. For some embodiments, such a corrosion protection coating may include an electrolytic nickel plating or any other coating material suitable for laser welding that does not produce micro-cracks during laser seam welding to keep the module hermetically sealed. For some embodiments, the outer sleeve 80, fiber attachment sleeve 202 or both may be made from materials such as Arcap® or other materials suitable for soldering or epoxy attachment. For some embodiments, the input end 42 of the optical fiber 44 may extend from the input surface 204 of fiber attachment sleeve 202 a length of about 0.5 mm to about 1 mm.

For the embodiment shown, the flange portion 82 may be seam welded around its entire circumference to the wall 52 of the housing 46 to produce a hermetic seal between the outer sleeve 80 and the housing 46. The fiber attachment sleeve 202 may also be seam welded around an entire circumference of an outer surface of the proximal portion of the outer sleeve 80 to produce a hermetic seal between the outer sleeve 80 and the fiber attachment sleeve 202. If the outer surface of the fiber 44 is soldered or otherwise hermetically sealed to the axial lumen of the fiber attachment sleeve 202, a hermetic seal between an outer surface of the fiber 44 and the housing 46 may be created that produces a reliable seal and also allows for adjustment of radial and axial position of the input end 42 of the optical fiber 44 during assembly of the apparatus 40. In addition, the lid 50 of the enclosure 46 may also be secured to the housing 46 by a hermetic sealing technique such as soldering, laser seam welding or the like. As such, a hermetic seal may be created between an outer surface of the optical fiber 44 and an interior cavity of the enclosure 46 as a whole.

With regard to the above detailed description, like reference numerals used therein refer to like elements that may have the same or similar dimensions, materials and configurations. While particular forms of embodiments have been illustrated and described, it will be apparent that various modifications can be made without departing from the spirit and scope of the embodiments of the invention. Accordingly, it is not intended that the invention be limited by the forgoing detailed description.

What is claimed is:

1. A ferrule assembly for positioning an input surface of an optical fiber, comprising:
an outer sleeve including a barrel portion with an inner bore extending along an axial length of the barrel portion and a flange member extending radially from the barrel portion, the flange member including a distal facing front surface;
a fiber attachment sleeve which is secured to the outer sleeve and which includes an outer surface sized to slide axially within the inner bore of the outer sleeve, an axial fiber receiving lumen disposed concentrically with the outer surface and an input end; and
an optical fiber secured to the fiber attachment sleeve with an input end of the optical fiber being disposed distally beyond the input end of the fiber attachment sleeve and disposed within the inner bore of the outer sleeve.

2. The ferrule assembly of claim 1 wherein the input end of the optical fiber is substantially axially coextensive with the distal facing front surface of the flange member.

3. A ferrule assembly for positioning an input surface of an optical fiber, comprising:
an outer sleeve including a barrel portion with an inner bore extending along an axial length of the barrel portion and a flange member extending radially from the barrel portion, the flange member including a distal facing front surface;
a fiber attachment sleeve which is secured to the outer sleeve and which includes an outer surface sized to slide axially within the inner bore of the outer sleeve, the fiber attachment sleeve including a stepped axial lumen which is concentric with an outer surface of the fiber attachment sleeve and which includes a minor transverse dimension portion of the stepped axial lumen which extends extending proximally from an input end of the fiber attachment sleeve and a major transverse dimension portion of the stepped axial lumen disposed proximally of the minor transverse dimension portion, the minor transverse dimension portion having a transverse dimension which is stepped down relative to a transverse dimension of the major transverse dimension portion; and
an optical fiber which is secured within the stepped axial lumen of the fiber attachment sleeve with an input end of the optical fiber being disposed distally beyond the input end of the fiber attachment sleeve and being disposed within the inner bore of the outer sleeve.

4. The ferrule assembly of claim 3 wherein the input end of the optical fiber is disposed substantially axially coextensive with the distal facing front surface of the flange member of the outer sleeve.

5. The ferrule assembly of claim 3 wherein the optical fiber is secured to the fiber attachment sleeve by a soft solder disposed in the major transverse dimension portion of the stepped axial lumen of the fiber attachment sleeve between an outer surface of the optical fiber and an inner surface of the stepped axial lumen and a hard solder disposed within the minor transverse dimension portion of the stepped axial lumen of the fiber attachment sleeve between an outer surface of the optical fiber and an inner surface of the stepped axial lumen.

6. The ferrule assembly of claim 5 wherein the soft solder comprises indium silver solder.

7. The ferrule assembly of claim 5 wherein the hard solder comprises gold tin solder.

8. The ferrule assembly of claim 3 wherein the minor transverse dimension portion of the stepped axial lumen of the fiber attachment sleeve has a transverse dimension of about 125 microns to about 700 microns.

9. The ferrule assembly of claim 3 wherein the major transverse dimension portion of the stepped axial lumen of the fiber attachment sleeve has a transverse dimension of about 500 microns to about 1500 microns.

10. The ferrule assembly of claim 3 wherein an outer surface of the optical fiber further comprises a metallic layer disposed over an axial portion of the optical fiber within the fiber attachment sleeve.

11. The ferrule assembly of claim 10 wherein the outer surface of the optical fiber comprises no metallic layer on a portion of the optical fiber that extends distally from the input end of the fiber attachment sleeve.

12. The ferrule assembly of claim 3 wherein the fiber attachment sleeve has an axial length of about 5 mm to about 15 mm.

13. The ferrule assembly of claim 3 wherein a front input surface of the input end of the fiber attachment sleeve comprises gold plating.

14. The ferrule assembly of claim 1 wherein an outer surface of the fiber attachment sleeve is secured to a proximal portion of the outer sleeve by a seam weld.

15. The ferrule assembly of claim 14 wherein the seam weld between the outer surface of the fiber attachment sleeve and proximal portion of the outer sleeve extends around the entire circumference of an outer surface of the fiber attachment sleeve to produce a hermetic seal between the outer sleeve and the fiber attachment sleeve.

16. The ferrule assembly of claim 1 wherein an outer surface of a jacketed portion of the optical fiber disposed proximally of the input end of the optical fiber is secured to an inside surface of the cylindrical fiber attachment sleeve with adhesive.

17. The ferrule assembly of claim 1 wherein the fiber attachment sleeve comprises a cylindrical fiber attachment sleeve.

18. The ferrule assembly of claim 3 wherein the fiber attachment sleeve comprises a cylindrical fiber attachment sleeve.

19. The ferrule assembly of claim 5 wherein a hermetic seal is formed between an outer surface of the optical fiber and the fiber attachment sleeve.

20. The ferrule assembly of claim 3 wherein an outer surface of the fiber attachment sleeve is secured to a proximal portion of the outer sleeve by a seam weld.

21. The ferrule assembly of claim 20 wherein the seam weld between the outer surface of the fiber attachment sleeve and proximal portion of the outer sleeve extends around the entire circumference of an outer surface of the fiber attachment sleeve to produce a hermetic seal between the outer sleeve and the fiber attachment sleeve.

* * * * *

UNITED STATES PATENT AND TRADEMARK OFFICE
CERTIFICATE OF CORRECTION

PATENT NO. : 8,553,737 B2  Page 1 of 1
APPLICATION NO. : 12/337275
DATED : October 8, 2013
INVENTOR(S) : Serge Cutillas et al.

It is certified that error appears in the above-identified patent and that said Letters Patent is hereby corrected as shown below:

In the Claims

Column 25
    Claim 3, line 35 should read:
        "extends proximally from an input end of the"
Column 26
    Claim 13, line 25 should read:
        "13. The ferrule assembly of claim 3 wherein a front"

Signed and Sealed this
Fourteenth Day of July, 2015

Michelle K. Lee
*Director of the United States Patent and Trademark Office*